US009525123B2

(12) United States Patent
Uebayashi et al.

(10) Patent No.: US 9,525,123 B2
(45) Date of Patent: Dec. 20, 2016

(54) PIEZOELECTRIC MATERIAL, PIEZOELECTRIC ELEMENT, MULTILAYERED PIEZOELECTRIC ELEMENT. LIQUID DISCHARGE HEARD, LIQUID DISCHARGE APPARATUS, ULTRASONIC MOTOR, OPTICAL APPARATUS, VIBRATORY APPARATUS, DUST REMOVING DEVICE, IMAGE PICKUP APPARATUS, AND ELECTRONIC EQUIPMENT

(71) Applicant: CANON KABUSHIKI KAISHA, Tokyo (JP)

(72) Inventors: Akira Uebayashi, Tokyo (JP); Hiroshi Saito, Kawasaki (JP); Kanako Oshima, Tokyo (JP); Jumpei Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/439,215

(22) PCT Filed: Oct. 23, 2013

(86) PCT No.: PCT/JP2013/079475
§ 371 (c)(1),
(2) Date: Apr. 28, 2015

(87) PCT Pub. No.: WO2014/069549
PCT Pub. Date: May 8, 2014

(65) Prior Publication Data
US 2015/0295161 A1    Oct. 15, 2015

(30) Foreign Application Priority Data
Nov. 2, 2012    (JP) .................................. 2012-242782

(51) Int. Cl.
*H01L 41/18*    (2006.01)
*H01L 41/187*    (2006.01)
(Continued)

(52) U.S. Cl.
CPC ............. *H01L 41/1871* (2013.01); *B06B 1/06* (2013.01); *B32B 18/00* (2013.01); *B41J 2/14072* (2013.01);
(Continued)

(58) Field of Classification Search
CPC .... H01L 41/18; C04B 35/49; C04B 35/63416; C04B 35/6342; C04B 35/63424
(Continued)

(56) References Cited

U.S. PATENT DOCUMENTS

| 6,160,472 A | 12/2000 | Arashi |
|---|---|---|
| 2003/0147194 A1 | 8/2003 | Hibi |

(Continued)

FOREIGN PATENT DOCUMENTS

| CN | 101050118 A | 10/2007 |
|---|---|---|
| CN | 101489952 A | 7/2009 |

(Continued)

OTHER PUBLICATIONS

Jiang, M., et al. Effects of MnO2 and sintering temperature on microstructure, ferroelectric and piezoelectric properties of Ba0.85Ca0.15Ti0.90Zr0.10O3 lead-free ceramics, J Mater Sci (2013) 48:1035-1041.*

(Continued)

*Primary Examiner* — J. San Martin
(74) *Attorney, Agent, or Firm* — Canon U.S.A., Inc. IP Division

(57) ABSTRACT

There is provided a lead-free piezoelectric material having a high and stable piezoelectric constant and mechanical quality factor in a wide operating temperature range.

A piezoelectric material mainly composed of a perovskite type metal oxide having the general formula (1), wherein manganese is incorporated in the metal oxide, and the Mn content is 0.12 parts by weight or more and 0.40 parts by weight or less on a metal basis per 100 parts by weight of the metal oxide.

$$(Ba_{1-x}Ca_x)_a(Ti_{1-y-z}Sn_yZr_z)O_3 \quad (1)$$

($1.00 \leq a \leq 1.01$, $0.125 \leq x \leq 0.300$, $0 < y \leq 0.020$, and $0.041 \leq z \leq 0.069$).

29 Claims, 15 Drawing Sheets

(51) Int. Cl.

| | | |
|---|---|---|
| B32B 18/00 | (2006.01) | |
| C04B 35/468 | (2006.01) | |
| C04B 35/49 | (2006.01) | |
| C04B 35/634 | (2006.01) | |
| H01L 41/43 | (2013.01) | |
| H01L 41/083 | (2006.01) | |
| H01L 41/09 | (2006.01) | |
| H01L 41/273 | (2013.01) | |
| H02N 2/10 | (2006.01) | |
| H02N 2/16 | (2006.01) | |
| B41J 2/14 | (2006.01) | |
| B06B 1/06 | (2006.01) | |
| G02B 7/04 | (2006.01) | |
| G02B 27/00 | (2006.01) | |
| H02N 2/00 | (2006.01) | |
| H04N 7/18 | (2006.01) | |

(52) U.S. Cl.
CPC ........ *B41J 2/14201* (2013.01); *C04B 35/4682* (2013.01); *C04B 35/49* (2013.01); *C04B 35/6342* (2013.01); *C04B 35/63416* (2013.01); *C04B 35/63424* (2013.01); *G02B 7/04* (2013.01); *G02B 27/0006* (2013.01); *H01L 41/083* (2013.01); *H01L 41/0973* (2013.01); *H01L 41/273* (2013.01); *H01L 41/43* (2013.01); *H02N 2/001* (2013.01); *H02N 2/106* (2013.01); *H02N 2/163* (2013.01); *H04N 7/18* (2013.01); *C04B 2235/3206* (2013.01); *C04B 2235/3208* (2013.01); *C04B 2235/3215* (2013.01); *C04B 2235/3236* (2013.01); *C04B 2235/3248* (2013.01); *C04B 2235/3267* (2013.01); *C04B 2235/3293* (2013.01); *C04B 2235/444* (2013.01); *C04B 2235/449* (2013.01); *C04B 2235/5445* (2013.01); *C04B 2235/604* (2013.01); *C04B 2235/6025* (2013.01); *C04B 2235/662* (2013.01); *C04B 2235/72* (2013.01); *C04B 2235/768* (2013.01); *C04B 2235/77* (2013.01); *C04B 2235/786* (2013.01); *C04B 2235/79* (2013.01); *C04B 2237/346* (2013.01); *C04B 2237/348* (2013.01)

(58) Field of Classification Search
USPC ........................................................ 310/358
See application file for complete search history.

(56) References Cited

U.S. PATENT DOCUMENTS

| | | | |
|---|---|---|---|
| 2005/0095851 A1* | 5/2005 | Watanabe | C04B 35/465 438/663 |
| 2009/0128989 A1 | 5/2009 | Suzuki | |
| 2009/0207551 A1* | 8/2009 | Suzuki | C01G 23/002 361/301.4 |
| 2013/0088120 A1* | 4/2013 | Hayashi | B08B 7/026 310/311 |
| 2013/0250417 A1* | 9/2013 | Ohashi | H01L 41/43 359/507 |
| 2013/0278681 A1* | 10/2013 | Saito | H01L 41/1871 347/68 |
| 2014/0184876 A1* | 7/2014 | Tanaka | B41J 2/14233 348/335 |
| 2014/0184878 A1* | 7/2014 | Watanabe | B41J 2/14201 348/340 |
| 2015/0015121 A1* | 1/2015 | Watanabe | B41J 2/14233 310/365 |
| 2015/0015643 A1* | 1/2015 | Oshima | B41J 2/14233 347/44 |
| 2015/0349236 A1* | 12/2015 | Furuta | B41J 2/14233 348/208.11 |
| 2015/0349666 A1* | 12/2015 | Ifuku | H01L 41/257 310/323.06 |

FOREIGN PATENT DOCUMENTS

| | | | |
|---|---|---|---|
| CN | 102531578 A | | 7/2012 |
| EP | 734031 A2 | | 9/1996 |
| JP | 2009-215111 A | | 9/2009 |
| JP | 2010-120835 A | | 6/2010 |
| JP | 2013032267 A | * | 2/2013 |
| JP | 2013241326 A | * | 12/2013 |
| KR | 10-2009-0015146 A | | 2/2009 |
| WO | 2012/070667 A1 | | 5/2012 |
| WO | 2012093646 A1 | | 7/2012 |
| WO | 2013/005702 A1 | | 1/2013 |

OTHER PUBLICATIONS

Xue, et al. "Elastic, piezoelectric, and dielectic properties of Ba(Zr0.2Ti0.8)O3-50(Ba0.7Ca0.3)TiO3 Pb-free ceramic at the morphotrophic phase boundary". Journal of Applied Physics, 2011, 109, 054110-1 to 054110-6.

Tanaka et al. "High Power Characteristics of (Ca, Ba)TiO3 Piezoelectric Ceramics with High Mechanical Quality Factor". Japanese Journal of Applied Physics 49 (2010) 09MD03.

\* cited by examiner

PIEZOELECTRIC MATERIAL, PIEZOELECTRIC ELEMENT, MULTILAYERED PIEZOELECTRIC ELEMENT. LIQUID DISCHARGE HEARD, LIQUID DISCHARGE APPARATUS, ULTRASONIC MOTOR, OPTICAL APPARATUS, VIBRATORY APPARATUS, DUST REMOVING DEVICE, IMAGE PICKUP APPARATUS, AND ELECTRONIC EQUIPMENT

TECHNICAL FIELD

The present invention relates to a piezoelectric material and more particularly to a lead-free piezoelectric material. The present invention also relates to a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

BACKGROUND ART

In general, piezoelectric materials are $ABO_3$ perovskite type metal oxides, such as lead zirconate titanate (hereinafter referred to as "PZT"). However, PZT contains lead as an A site element, and its effect on the environment is regarded as a problem. Thus, there is a demand for piezoelectric materials of lead-free perovskite type metal oxides.

One known piezoelectric material of a lead-free perovskite type metal oxide is barium titanate. In order to improve the characteristics of barium titanate, materials based on barium titanate are being developed. PTL 1 and NPL 1 disclose materials having an improved piezoelectric property in which the A site of barium titanate is partly substituted by Ca and the B site is partly substituted by Zr. However, these materials disadvantageously have a Curie temperature as low as 80° C. or less and therefore cause depolarization and deterioration in piezoelectric property under a high-temperature environment, such as in a car in summer. Furthermore, because of their low mechanical quality factors, these materials disadvantageously cause depolarization upon the application of an alternating voltage.

PTL 2 and NPL 2 disclose materials in which the A site of barium titanate is partly substituted by Ca and to which Mn, Fe, or Cu is added. These materials have a higher mechanical quality factor than barium titanate but disadvantageously have a poor piezoelectric property.

CITATION LIST

Patent Literature

PTL 1 Japanese Patent Laid-Open No. 2009-215111
PTL 2 Japanese Patent Laid-Open No. 2010-120835

Non Patent Literature

NPL 1 Journal of Applied Physics, 2011, 109, 054110-1 to 054110-6
NPL 2 Japanese Journal of Applied Physics, 2010, vol. 49, 09MD03-1 to 09MD03-4

SUMMARY OF INVENTION

Technical Problem

The present invention addresses these problems and provides a lead-free piezoelectric material having a high and stable piezoelectric constant and mechanical quality factor in a wide operating temperature range.

The present invention also provides a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

A piezoelectric material according to one aspect of the present invention is mainly composed of a perovskite type metal oxide having the following general formula (1), wherein manganese is incorporated in the metal oxide, and the Mn content is 0.12 parts by weight or more and 0.40 parts by weight or less on a metal basis per 100 parts by weight of the metal oxide.

$$(Ba_{1-x}Ca_x)_a(Ti_{1-y-z}Sn_yZr_z)O_3 \tag{1}$$

($1.00 \le a \le 1.01$,  $0.125 \le x \le 0.300$,  $0 < y \le 0.020$, and $0.041 \le z \le 0.069$)

A piezoelectric element according to one aspect of the present invention includes a first electrode, a piezoelectric material, and a second electrode, wherein the piezoelectric material is the piezoelectric material described above.

A multilayered piezoelectric element according to one aspect of the present invention includes piezoelectric material layers and electrode layers alternately stacked on top of one another. The electrode layers include an internal electrode. The piezoelectric material layers are formed of the piezoelectric material described above.

A liquid discharge head according to one aspect of the present invention includes a liquid chamber and a discharge port in communication with the liquid chamber. The liquid chamber has a vibrating unit that includes the piezoelectric element or the multilayered piezoelectric element described above.

A liquid discharge apparatus according to one aspect of the present invention includes a mounting portion for a transfer medium and the liquid discharge head described above.

An ultrasonic motor according to one aspect of the present invention includes a vibrating member and a moving body in contact with the vibrating member. The vibrating member includes the piezoelectric element or the multilayered piezoelectric element described above.

An optical apparatus according to one aspect of the present invention includes a drive unit that includes the ultrasonic motor described above.

A vibratory apparatus according to one aspect of the present invention includes a vibrating member that includes the piezoelectric element or the multilayered piezoelectric element described above.

A dust removing device according to one aspect of the present invention includes a vibrating member that includes the piezoelectric element or the multilayered piezoelectric element described above.

An image pickup apparatus according to one aspect of the present invention includes the dust removing device described above and an image pickup element unit, wherein the dust removing device includes a vibrating unit on a light-receiving surface of the image pickup element unit.

Electronic equipment according to one aspect of the present invention includes a piezoelectric acoustic component that includes the piezoelectric element or the multilayered piezoelectric element described above.

DESCRIPTION OF EMBODIMENTS

Figure 1:
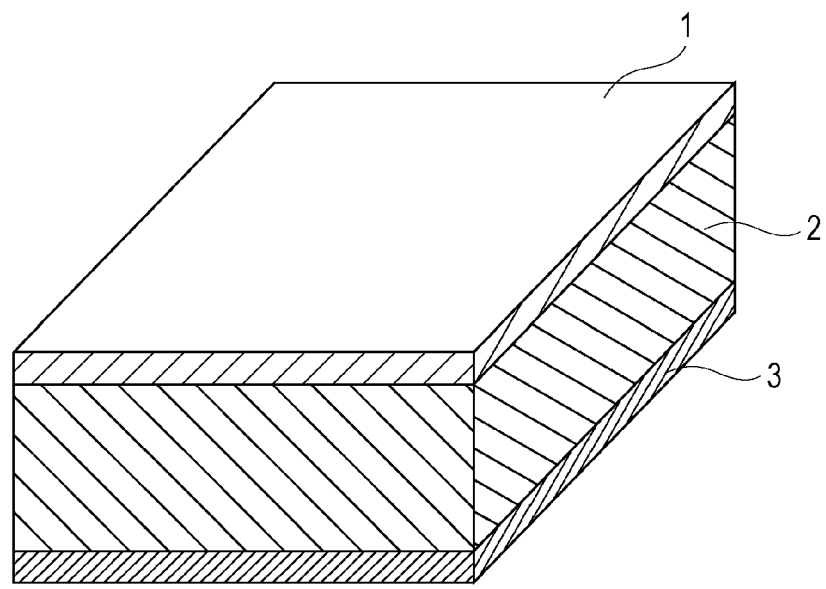
FIG. 1 is a schematic view of a piezoelectric element according to an embodiment of the present invention.

Embodiments of the present invention will be described below.

A piezoelectric material according to one embodiment of the present invention is mainly composed of a perovskite type metal oxide having the following general formula (1), wherein manganese is incorporated in the metal oxide, and the Mn content is 0.12 parts by weight or more and 0.40 parts by weight or less on a metal basis per 100 parts by weight of the metal oxide.

$$(Ba_{1-x}Ca_x)_a(Ti_{1-y-z}Sn_yZr_z)O_3 \quad (1)$$

$(1.00 \le a \le 1.01, \quad 0.125 \le x \le 0.300, \quad 0 < y \le 0.020,$ and $0.041 \le z \le 0.069)$ (Perovskite Metal Oxide)

The term "perovskite type metal oxide", as used herein, refers to a metal oxide having a perovskite structure, which is ideally a cubic structure, as described in Iwanami Rikagaku Jiten, 5th edition (Iwanami Shoten, published on Feb. 20, 1998). A metal oxide having a perovskite structure is generally represented by the chemical formula $ABO_3$. In a perovskite type metal oxide, elements A and B in the form of ions occupy particular positions of a unit cell referred to as the A site and the B site, respectively. For a cubic unit cell, the element A occupies the vertexes of the cube, and the element B occupies the body-centered position of the cube. The element O as an oxygen anion occupies the face-centered positions of the cube.

In the metal oxide having the general formula (1), the metallic elements at the A site are Ba and Ca, and the metallic elements at the B site are Ti, Zr, and Sn. Part of Ba and Ca may occupy the B site. Likewise, part of Ti and Zr may occupy the A site. However, Sn should not occupy the A site because this impairs the piezoelectric property.

In the general formula (1), although the molar ratio of the B site element to the element O is 1:3, small variations in the molar ratio (for example, 1.00:2.94 to 1.00:3.06) are within the scope of the present invention, provided that the metal oxide has the perovskite structure as the primary phase.

The perovskite structure of the metal oxide can be determined by structural analysis using X-ray diffraction or electron diffraction.

A piezoelectric material according to an embodiment of the present invention may have any form, such as a ceramic, powder, single crystal, membrane, or slurry. The term "ceramic", as used herein, refers to an aggregate of crystal grains (also referred to as a bulk), that is, a polycrystalline material, containing a metal oxide as the base component and sintered by heat treatment. The term "ceramic" also includes a ceramic processed after sintering.

(Main Component of Piezoelectric Material)

In a piezoelectric material according to an embodiment of the present invention, the value a of the general formula (1), which represents the ratio of the number of moles of Ba and Ca at the A site to the number of moles of Ti, Zr, and Sn at the B site, is in the range of $1.00 \le a \le 1.01$. A value a of less than 1.00 tends to result in abnormal grain growth and a decrease in the mechanical strength of the material. A value a of more than 1.01 results in an excessively high grain growth temperature, making sintering of the material impossible in common furnaces. The phrase "making sintering of the material impossible" means that the piezoelectric material has a low density or contains many pores and defects. The value a is preferably in the range of $1.004 \le a \le 1.009$.

The value x of the general formula (1), which represents the molar ratio of Ca at the A site, is in the range of $0.125 \le x \le 0.300$. A value x of less than 0.125 results in structural phase transition at an operating temperature, thereby adversely affecting durability. A value x of more than 0.300 results in a reduced piezoelectric property. The value x is preferably in the range of $0.155 \le x \le 0.240$.

The value z of the general formula (1), which represents the molar ratio of Zr at the B site, is in the range of $0.041 \le z \le 0.069$. A value z of less than 0.041 results in a reduced piezoelectric property. A value z of more than 0.069 results in a low Curie temperature ($T_C$) of less than 100° C. and a reduced piezoelectric property at high temperatures.

The value y of the general formula (1), which represents the molar ratio of Sn at the B site, is in the range of $0<y\leq0.020$. A value y of more than 0.020 results in a low Curie temperature ($T_C$) of less than 100° C. and a reduced piezoelectric property at high temperatures. The value y is preferably in the range of $0.005\leq y\leq0.020$.

The molar ratio z of Zr and the molar ratio y of Sn at the B site may satisfy the relation of $z\leq-2y+0.100$. $Z>-2y+0.100$ may result in a low Curie temperature ($T_{Cc}$) of less than 105° C. and a reduced piezoelectric property at high temperatures.

The term "Curie temperature ($T_C$)", as used herein, refers to a temperature at which the ferroelectricity of a material is lost. In general, the piezoelectric property of a piezoelectric material is also lost at the Curie temperature or higher. The Curie temperature may be determined by directly measuring the temperature at which ferroelectricity is lost or measuring the temperature at which the relative dielectric constant reaches its maximum in a very small alternating electric field.

The composition of a piezoelectric material according to an embodiment of the present invention may be determined by any method, such as X-ray fluorescence spectroscopy, ICP spectroscopy, or atomic absorption spectrometry. The weight ratio and the composition ratio of the elements of the piezoelectric material can be determined by using any of these methods.

The Mn content of a piezoelectric material according to an embodiment of the present invention is 0.12 parts by weight or more and 0.40 parts by weight or less on a metal basis per 100 parts by weight of the metal oxide. When the Mn content of a piezoelectric material according to an embodiment of the present invention is in this range, the piezoelectric material has an improved insulation property and mechanical quality factor. The term "mechanical quality factor" refers to a coefficient that represents elastic loss resulting from vibration in the evaluation of a piezoelectric material as an oscillator. The mechanical quality factor is observed as the sharpness of a resonance curve in impedance measurement. Thus, the mechanical quality factor is a coefficient that represents the sharpness of resonance of an oscillator. An improvement in insulation property or mechanical quality factor ensures long-term reliability of the piezoelectric material when the piezoelectric material is driven as a piezoelectric element by the application of a voltage.

The term "on a metal basis", as used herein in the context of the Mn content, refers to the weight ratio of Mn metal to 100 parts by weight of the constituent elements of the metal oxide having the general formula (1) on an oxide basis, which is calculated from the amounts of Ba, Ca, Ti, Zr, Mg, and Mn of the piezoelectric material measured, for example, by X-ray fluorescence spectroscopy (XRF), ICP spectroscopy, or atomic absorption spectrometry. A Mn content of less than 0.12 parts by weight results in a mechanical quality factor as low as less than 400. A low mechanical quality factor results in a very high power consumption when a piezoelectric element made of the piezoelectric material is operated as a resonance device. The mechanical quality factor of a piezoelectric material for use in resonance elements is preferably 800 or more, more preferably 1000 or more. In this range, there is no significant increase in power consumption in practical operation. A Mn content of more than 0.40 parts by weight results in a markedly reduced piezoelectric property because of the presence of crystals having a hexagonal structure, which do not contribute to the piezoelectric property. The Mn content is preferably 0.18 parts by weight or more and 0.40 parts by weight or less on a metal basis per 100 parts by weight of the metal oxide having the general formula (1). Mn can occupy only the B site. Mn can have a valence of 4+. In general, Mn can have a valence of 4+, 2+, or 3+. In the presence of conduction electrons in crystals (for example, in the presence of oxygen vacancies in crystals or in the presence of donor elements occupying the A site), Mn having a valence of 4+ can trap the conduction electrons and improve insulation resistance by reducing its valence to 3+ or 2+. In terms of the ionic radius, Mn having a valence of 4+ can easily substitute for the main component Ti of the B site.

Mn having a valence of less than 4+, such as 2+, acts as an acceptor. The presence of Mn as an acceptor in perovskite crystals results in the formation of holes or oxygen vacancies in the crystals.

When most of Mn in the piezoelectric material has a valence of 2+ or 3+, holes cannot be compensated for with oxygen vacancies alone, and the insulation resistance decreases. Thus, Mn can mostly have a valence of 4+. A minor proportion of Mn may have a valence of less than 4+ and occupy the B site of the perovskite structure as an acceptor or form oxygen vacancies. Mn having a valence of 2+ or 3+ and oxygen vacancies can form defect dipoles and thereby improve the mechanical quality factor of a piezoelectric material.

(Mg Content)

A piezoelectric material according to an embodiment of the present invention can contain 0.10 parts by weight or less of Mg on a metal basis per 100 parts by weight of the piezoelectric material as an auxiliary component. The piezoelectric material having a Mg content in this range has an improved mechanical quality factor.

The term "on a metal basis", as used herein in the context of the Mg content, refers to the weight ratio of the Mg metal to 100 parts by weight of the constituent elements of the metal oxide having the general formula (1) on an oxide basis, which is calculated from the amounts of Ba, Ca, Ti, Zr, Mn, and Mg of the piezoelectric material measured, for example, by X-ray fluorescence spectroscopy (XRF), ICP spectroscopy, or atomic absorption spectrometry.

A Mg content of more than 0.10 parts by weight results in a mechanical quality factor as low as less than 600. A low mechanical quality factor results in a high power consumption when a piezoelectric element made of the piezoelectric material is operated as a resonance device. The mechanical quality factor is preferably 800 or more, more preferably 1000 or more. In order to improve the mechanical quality factor, the Mg content may be 0.05 parts by weight or less.

Mg may be contained in the piezoelectric material as a Mg component and is not limited to metal Mg. For example, Mg may be dissolved in the A site or the B site of the perovskite structure or may be contained in grain boundaries. The piezoelectric material may contain a Mg component in the form of metal, ion, oxide, metal salt, or complex.

A piezoelectric material according to an embodiment of the present invention may contain a component (hereinafter referred to as an auxiliary component) other than the metal oxide having the general formula (1), Mn, and Mg without variations in characteristics. The amount of auxiliary component may be 1.2 parts by weight or less per 100 parts by weight of the metal oxide having the general formula (1). More than 1.2 parts by weight of the auxiliary component may result in a reduced piezoelectric property or insulation property of the piezoelectric material. The amount of metallic elements of the auxiliary component other than Ba, Ca, Ti, Sn, Zr, Mn, and Mg may be 1.0 part by weight or less on an oxide basis or 0.9 parts by weight or less on a metal basis per 100 parts by weight of the piezoelectric material. The term "metallic elements", as used herein, includes metalloid elements such as Si, Ge, and Sb. When the amount of metallic elements of the auxiliary component other than Ba, Ca, Ti, Sn, Zr, Mn, and Mg is more than 1.0 part by weight on an oxide basis or more than 0.9 parts by weight on a metal basis per 100 parts by weight of the piezoelectric material, this may result in a markedly reduced piezoelectric property or insulation property of the piezoelectric material. The total amount of Li, Na, and Al elements of the auxiliary component may be 0.5 parts by weight or less on a metal basis per 100 parts by weight of the piezoelectric material. When the total amount of Li, Na, and Al elements of the auxiliary component is more than 0.5 parts by weight on a metal basis per 100 parts by weight of the piezoelectric material, this may result in insufficient sintering. The total amount of Y and V elements of the auxiliary component may be 0.2 parts by weight or less on a metal basis per 100 parts by weight of the piezoelectric material. When the total amount of Y and V elements of the auxiliary component is more than 0.2 parts by weight on a metal basis per 100 parts by weight of the piezoelectric material, this may make polarization treatment difficult.

The auxiliary component may be a sintering aid, such as Si or Cu. A piezoelectric material according to an embodiment of the present invention may contain Sr inevitably contained in commercially available raw materials for Ba and Ca. A piezoelectric material according to an embodiment of the present invention may also contain Nb inevitably contained in a commercially available raw material for Ti and Hf inevitably contained in a commercially available raw material for Zr.

The parts by weight of the auxiliary component may be measured by any method, such as X-ray fluorescence spectroscopy, ICP spectroscopy, or atomic absorption spectrometry.

(Phase Transition Temperature)

A piezoelectric material according to an embodiment of the present invention may have no structural phase transition temperature in the range of −25° C. to 100° C.

Generally known barium titanate has an orthorhombic-to-tetragonal transition temperature (hereinafter referred to as $T_{o \to t}$) of approximately 17° C. and a tetragonal-to-orthorhombic transition temperature ($T_{t \to o}$) of approximately 5° C. The transition temperature of the crystal structure is referred to as a structural phase transition temperature. While repeatedly passing through these structural phase transition temperatures because of ambient temperature changes, the piezoelectric material may gradually become depolarized because of repeated variations in the unit cell volume and polarization axial direction, resulting in a reduced piezoelectric property. Thus, barium titanate is difficult to use in a wide temperature range. A piezoelectric material according to an embodiment of the present invention has $T_{o \to t}$ of less than −25° C. and does not have the problem described above. A piezoelectric material according to an embodiment of the present invention has a Curie temperature ($T_c$) for tetragonal-to-cubic transition higher than 100° C. and can maintain piezoelectricity even at an excessively high temperature of 80° C. as in a car in summer. A piezoelectric material according to an embodiment of the present invention can maintain a tetragonal structure at a temperature in the range of −25° C. to 100° C. and maintain a high mechanical quality factor. Furthermore, the piezoelectric material can avoid the use of an orthorhombic crystal region having a relatively low mechanical quality factor. Thus, the piezoelectric material can have a high and stable piezoelectric constant and mechanical quality factor in a wide operating temperature range.

(Grain Size)

The average equivalent circular diameter of crystal grains of a piezoelectric material according to an embodiment of the present invention may be 1 μm or more and 10 μm or less. A piezoelectric material according to an embodiment of the present invention can have a satisfactory piezoelectric property and mechanical strength if it has an average equivalent circular diameter in this range. An average equivalent circular diameter of less than 1 μm may result in a reduced piezoelectric property. An average equivalent circular diameter of more than 10 μm may result in reduced mechanical strength. The term "equivalent circular diameter", as used herein, refers to a "projected area equivalent circular diameter" generally referred to in microscopy and refers to the diameter of a perfect circle having the same area as the projected area of a crystal grain. In the present invention, the equivalent circular diameter may be determined by any method. For example, the equivalent circular diameter may be determined by the image processing of an image of a surface of the piezoelectric material taken with a polarizing microscope or a scanning electron microscope. Since the optimum magnification depends on the particle size to be measured, an optical microscope or an electron microscope may be selected in accordance with the particle size. The equivalent circular diameter may be determined from an image of a polished surface or a cross section rather than the material surface.

(Density)

A piezoelectric material according to an embodiment of the present invention may have a relative density of 93% or more and 100% or less.

A relative density of less than 93% may result in a reduced piezoelectric property, mechanical quality factor, or mechanical strength.

(Production Method)

A method for producing a piezoelectric material according to an embodiment of the present invention is not particularly limited.

(Raw Materials)

A common method for sintering an oxide, carbonate, nitrate, or oxalate solid powder containing the constituent elements of a piezoelectric material at atmospheric pressure may be employed in the production of the piezoelectric material. The raw materials include metallic compounds, such as a Ba compound, a Ca compound, a Ti compound, a Sn compound, a Zr compound, a Mg compound, and a Mn compound.

Examples of the Ba compound include barium oxide, barium carbonate, barium oxalate, barium acetate, barium nitrate, barium titanate, barium zirconate, and barium zirconate titanate. The Ba compound may be of a commercially available high purity type (for example, a purity of 99.99% or more). A low-purity Ba compound contains a large amount of Mg, which may lower the mechanical quality factor of a piezoelectric material.

Examples of the Ca compound include calcium oxide, calcium carbonate, calcium oxalate, calcium acetate, calcium titanate, calcium zirconate, and calcium zirconate titanate. The Ca compound may be of a commercially available high purity type (for example, a purity of 99.99% or more). A low-purity Ca compound contains a large amount of Mg, which may lower the mechanical quality factor of a piezoelectric material.

Examples of the Ti compound include titanium oxide, barium titanate, barium zirconate titanate, and calcium titanate.

Examples of the Sn compound include tin oxide, barium stannate, barium stannate titanate, and calcium stannate.

Examples of the Zr compound include zirconium oxide, barium zirconate, barium zirconate titanate, and calcium zirconate.

Examples of the Mn compound include manganese carbonate, manganese oxide, manganese dioxide, manganese acetate, and trimanganese tetroxide.

Examples of the Mg compound include magnesium carbonate, magnesium oxide, magnesium hydroxide, magnesium peroxide, and magnesium chloride.

A raw material for controlling the ratio a of the number of moles of Ba and Ca at the A site to the number of moles of Ti, Sn, and Zr at the B site of a piezoelectric material according to an embodiment of the present invention is not particularly limited. A Ba compound, a Ca compound, a Ti compound, a Sn compound, and a Zr compound have the same effect.

(Granulated Powder)

The raw material powder of a piezoelectric material may be granulated by any method. Spray drying can make the particle size of the granulated powder more uniform.

A binder for use in granulation may be polyvinyl alcohol (PVA), polyvinyl butyral (PVB), or an acrylic resin. The amount of binder is preferably in the range of 1 to 10 parts by weight per 100 parts by weight of the raw material powder of a piezoelectric material, more preferably 2 to 5 parts by weight in order to increase the compact density.

(Sintering)

A method for sintering a piezoelectric material according to an embodiment of the present invention is not particularly limited.

Examples of the sintering method include sintering in an electric furnace, sintering in a gas furnace, electric heating, microwave sintering, millimeter-wave sintering, and hot isostatic pressing (HIP). Sintering in an electric furnace or a gas furnace may be performed in a continuous furnace or a batch furnace.

The sintering temperature of a piezoelectric material in the sintering method is not particularly limited and may be a temperature at which the compounds can react to sufficiently grow crystals. The sintering temperature is preferably 1200° C. or more and 1550° C. or less, more preferably 1300° C. or more and 1480° C. or less, such that the particle size of the piezoelectric ceramic is in the range of 1 to 10 μm. The piezoelectric ceramic sintered in the temperature range described above has satisfactory piezoelectric performance.

In order to ensure the reproducibility and stability of the characteristics of a piezoelectric material produced by sintering, sintering may be performed at a constant temperature within the range described above for two hours or more and 24 hours or less. Although two-step sintering may also be performed, a sintering method without an abrupt temperature change can improve productivity.

The piezoelectric ceramic may be polished and then heat-treated at a temperature of 1000° C. or more. Heat treatment of the piezoelectric material at a temperature of 1000° C. or more can relieve the residual stress of the piezoelectric material resulting from mechanically polishing and thereby improves the piezoelectric property of the piezoelectric ceramic. Heat treatment of the piezoelectric ceramic can also remove the raw material powder, such as barium carbonate, precipitated at grain boundaries. The heat-treatment time may be, but is not limited to, one hour or more.

(Piezoelectric Element)

A piezoelectric element according to an embodiment of the present invention will be described below.

FIG. 1 is a schematic view of a piezoelectric element according to an embodiment of the present invention. The piezoelectric element includes a first electrode 1, a piezoelectric material 2, and a second electrode 3. The piezoelectric material 2 is a piezoelectric material according to an embodiment of the present invention.

The piezoelectric property of a piezoelectric material according to an embodiment of the present invention can be evaluated by at least attaching a first electrode and a second electrode to the piezoelectric material to form a piezoelectric element. Each of the first electrode and the second electrode is an electrically conductive layer having a thickness in the range of approximately 5 nm to 10 μm. The materials of the first electrode and the second electrode are not particularly limited and may be any materials that are commonly used for piezoelectric elements. Examples of such materials include metals, such as Ti, Pt, Ta, Ir, Sr, In, Sn, Au, Al, Fe, Cr, Ni, Pd, Ag, and Cu, and compounds thereof.

Each of the first electrode and the second electrode may be made of one of these materials or may be a multilayer made of two or more of the materials. The material(s) of the first electrode may be different from the material(s) of the second electrode.

The first electrode and the second electrode may be manufactured by any method, for example, by baking of a metal paste, sputtering, or vapor deposition. The first electrode and the second electrode may have a desired pattern.

(Polarization)

The piezoelectric element may have a unidirectional spontaneous polarization axis. Having the unidirectional spontaneous polarization axis can increase the piezoelectric constant of the piezoelectric element.

The polarization method for the piezoelectric element is not particularly limited. Polarization treatment may be performed in the ambient atmosphere or in a silicone oil. The polarization temperature may be in the range of 60° C. to 150° C. The optimum conditions for polarization may vary with the composition of the piezoelectric material of the piezoelectric element. The electric field applied in polarization treatment may be in the range of 800 V/mm to 2.0 kV/mm.

(Resonance-Antiresonance Method)

The piezoelectric constant and the mechanical quality factor of the piezoelectric element can be calculated from the resonance frequency and the antiresonant frequency measured with a commercially available impedance analyzer in accordance with a standard of Japan Electronics and Information Technology Industries Association (JEITA EM-4501). This method is hereinafter referred to as a resonance-antiresonance method.

(Multilayered Piezoelectric Element)

A multilayered piezoelectric element according to an embodiment of the present invention will be described below.

The multilayered piezoelectric element includes piezoelectric material layers and electrode layers alternately stacked on top of one another. The electrode layers include an internal electrode. The piezoelectric material layers are formed of a piezoelectric material according to an embodiment of the present invention.

Figure 2A:
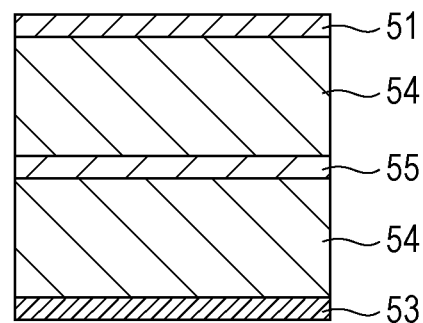
FIG. 2A is a schematic cross-sectional view of a multilayered piezoelectric element according to an embodiment of the present invention.
Figure 2B:
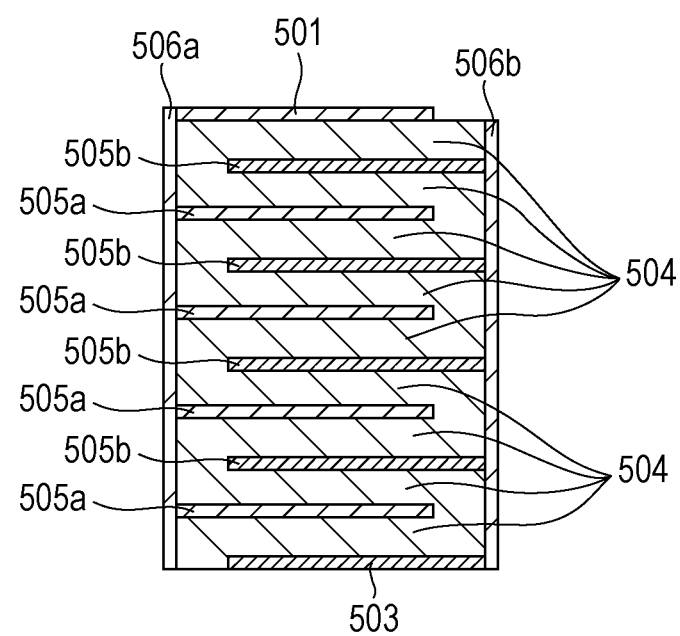
FIG. 2B is a schematic cross-sectional view of a multilayered piezoelectric element according to another embodiment of the present invention.

FIG. 2A is a schematic cross-sectional view of a multilayered piezoelectric element according to an embodiment of the present invention. FIG. 2B is a schematic cross-sectional view of a multilayered piezoelectric element according to another embodiment of the present invention. A multilayered piezoelectric element according to an embodiment of the present invention includes piezoelectric material layers 54 and electrodes including an internal electrode 55. The multilayered piezoelectric element includes the piezoelectric material layers and the layered electrodes alternately stacked on top of one another. The piezoelectric material layers 54 are made of the piezoelectric material described above. In addition to the internal electrode 55, the electrodes may include external electrodes, such as a first electrode 51 and a second electrode 53.

The multilayered piezoelectric element illustrated in FIG. 2A includes two piezoelectric material layers 54 and one internal electrode 55 interposed therebetween, and the multilayered structure is disposed between the first electrode 51 and the second electrode 53. The number of piezoelectric material layers and the number of internal electrodes are not particularly limited and may be increased, as illustrated in FIG. 2B. The multilayered piezoelectric element illustrated in FIG. 2B includes nine piezoelectric material layers 504 and eight internal electrodes 505 (505a or 505b) alternately stacked on top of one another, and the multilayered structure is disposed between a first electrode 501 and a second electrode 503. The multilayered piezoelectric element further includes an external electrode 506a and an external electrode 506b for connecting the internal electrodes to each other.

The size and shape of the internal electrodes 55 and 505 and the external electrodes 506a and 506b may be different from the size and shape of the piezoelectric material layers 54 and 504. Each of the internal electrodes 55 and 505 and the external electrodes 506a and 506b may be composed of a plurality of portions.

Each of the internal electrodes 55 and 505, the external electrodes 506a and 506b, the first electrodes 51 and 501, and the second electrodes 53 and 503 is an electrically conductive layer having a thickness in the range of approximately 5 nm to 10 µm. The material of each of the electrodes is not particularly limited and may be any material that is commonly used for piezoelectric elements. Examples of such a material include metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be made of one of these materials or a mixture or an alloy thereof or may be a multilayer made of two or more of the materials. These electrodes may be made of different materials. The internal electrodes 55 and 505 may be mainly composed of Ni, which is an inexpensive electrode material.

As illustrated in FIG. 2B, the plurality of electrodes including the internal electrodes 505 may be connected to each other in order to synchronize the driving voltage phases. For example, the internal electrodes 505a may be connected to the first electrode 501 through the external electrode 506a. The internal electrodes 505b may be connected to the second electrode 503 through the external electrode 506b. The internal electrodes 505a and the internal electrodes 505b may be alternately disposed. The electrodes may be connected by any method. For example, an electrode or an electric wire for connection may be disposed on a side surface of the multilayered piezoelectric element, or a through hole passing through the piezoelectric material layers 504 may be formed and coated with an electrically conductive material to connect the electrodes.

A method for manufacturing a multilayered piezoelectric element according to an embodiment of the present invention is not particularly limited and is exemplified as described below. An exemplary method includes (A) dispersing a metallic compound powder containing at least Ba, Ca, Ti, Zr, Sn, and Mn to form a slurry, (B) applying the slurry to a substrate to form a compact, (C) forming an electrode on the compact, and (D) sintering the compact on which the electrode has been formed to form a multilayered piezoelectric element. The term "powder", as used herein, refers to an aggregate of solid particles. The aggregate may be composed of particles each containing Ba, Ca, Ti, Sn, Zr, and Mn or different particles each containing a certain element.

The term "compact", as used herein, refers to a solid formed of the powder. The compact can be formed by uniaxial pressing, cold hydrostatic pressing, hot hydrostatic pressing, casting, or extrusion molding.

The compact may be formed from a granulated powder. Sintering of a compact formed from a granulated powder has an advantage that the grain size distribution of the sintered body tends to become uniform.

The metallic compound powder used in (A) may be a powder of a Ba compound, a Ca compound, a Ti compound, a Sn compound, a Zr compound, a Mn compound, and a Mg compound. Examples of the Ba compound include barium oxide, barium carbonate, barium oxalate, barium acetate, barium nitrate, barium titanate, barium zirconate, and barium zirconate titanate. The Ba compound may be of a commercially available high purity type (for example, a purity of 99.99% or more). A low-purity Ba compound contains a large amount of Mg, which may lower the mechanical quality factor of a piezoelectric material.

Examples of the Ca compound include calcium oxide, calcium carbonate, calcium oxalate, calcium acetate, calcium titanate, calcium zirconate, and calcium zirconate titanate. The Ca compound may be of a commercially available high purity type (for example, a purity of 99.99% or more). A low-purity Ca compound contains a large amount of Mg, which may lower the mechanical quality factor of a piezoelectric material.

Examples of the Ti compound include titanium oxide, barium titanate, barium zirconate titanate, and calcium titanate.

Examples of the Sn compound include tin oxide, barium stannate, barium stannate titanate, and calcium stannate.

Examples of the Zr compound include zirconium oxide, barium zirconate, barium zirconate titanate, and calcium zirconate.

Examples of the Mn compound include manganese carbonate, manganese oxide, manganese dioxide, manganese acetate, and trimanganese tetroxide.

Examples of the Mg compound include magnesium carbonate, magnesium oxide, magnesium hydroxide, magnesium peroxide, and magnesium chloride.

An exemplary method for preparing the slurry in (A) will be described below. The metallic compound powder is mixed with a solvent. The weight of the solvent is 1.6 to 1.7 times the weight of the metallic compound powder. The solvent may be toluene, ethanol, a mixed solvent of toluene and ethanol, n-butyl acetate, or water. After mixing in a ball mill for 24 hours, a binder and a plasticizer are added to the mixture. The binder may be polyvinyl alcohol (PVA), polyvinyl butyral (PVB), or an acrylic resin. When the binder is PVB, the weight ratio of the solvent to PVB may be 88:12.

The plasticizer may be dioctyl sebacate, dioctyl phthalate, or dibutyl phthalate. When the plasticizer is dibutyl phthalate, the weight of dibutyl phthalate is the same as the weight of the binder. The mixture is again mixed in the ball mill overnight. The amount of solvent or binder is controlled such that the slurry viscosity is in the range of 300 to 500 mPa·s.

The compact in (B) is a sheet of the mixture of the metallic compound powder, the binder, and the plasticizer. The compact in (B) may be formed by a sheet forming method. The sheet forming method may be a doctor blade method. In accordance with the doctor blade method, the slurry is applied to the substrate with a doctor blade and is dried to form a sheet of the compact. The substrate may be a polyethylene terephthalate (PET) film. A surface of the PET film on which the slurry is to be applied may be coated with a fluorine compound in order to facilitate the removal of the compact. The slurry may be dried by natural drying or hot-air drying. The thickness of the compact is not particularly limited and may be adjusted to the thickness of the multilayered piezoelectric element. The thickness of the compact can be increased with increasing viscosity of the slurry.

The electrodes in (C), more specifically, the internal electrodes 505 and the external electrodes 506a and 506b may be manufactured by any method, for example, baking of a metal paste, a sputtering process, a vapor deposition method, or a printing method. In order to reduce the driving voltage, the thickness and the intervals of the piezoelectric material layers 504 may be reduced. In such a case, a multilayered body containing precursors of the piezoelectric material layers 504 and the internal electrodes 505a and 505b is fired. The material of the internal electrodes should not change its shape or cause a deterioration in electrical conductivity at the sintering temperature of the piezoelectric material layers 504. A metal that has a lower melting point and is more inexpensive than Pt, such as Ag, Pd, Au, Cu, or Ni, or an alloy thereof, may be used for the internal electrodes 505a and 505b and the external electrodes 506a and 506b. The external electrodes 506a and 506b may be formed after firing the multilayered body. In this case, the external electrodes 506a and 506b may be made of Al or a carbonaceous electrode material, as well as Ag, Pd, Cu, or Ni.

These electrodes may be formed by screen printing. In accordance with screen printing, a metal paste is applied to the compact disposed on a substrate through a screen printing plate using a blade. The screen printing plate has a screen mesh. The metal paste is applied to the compact through the screen mesh. The screen mesh of the screen printing plate may have a pattern. The pattern can be transferred to the compact using the metal paste, thereby patterning an electrode on the compact.

After the electrode is formed in (C), one or a plurality of compacts removed from the substrate are stacked and press-bonded, for example, by uniaxial pressing, cold hydrostatic pressing, or hot hydrostatic pressing. Hot hydrostatic pressing can apply isotropically uniform pressure. Heating the compacts to approximately the glass transition point of the binder can enhance press bonding. A plurality of compacts can be press-bonded in order to achieve the desired thickness. For example, 10 to 100 layers of the compacts can be heat-pressed at a temperature in the range of 50° C. to 80° C. at a pressure in the range of 10 to 60 MPa for 10 seconds to 10 minutes. The electrodes may have an alignment mark in order to accurately stack the compacts. The compacts may have a positioning through hole in order to accurately stack the compacts.

The sintering temperature of the compact in (D) method is not particularly limited and may be a temperature at which the compounds can react to sufficiently grow crystals. The sintering temperature is preferably 1200° C. or more and 1550° C. or less, more preferably 1300° C. or more and 1480° C. or less, such that the particle size of the piezoelectric ceramic is in the range of 1 to 10 μm. A multilayered piezoelectric element sintered in the temperature range described above has satisfactory piezoelectric performance.

When the electrodes in (C) are mainly composed of Ni, (D) may be performed in a furnace that allows firing in an atmosphere. After the binder is removed by combustion in the ambient atmosphere at a temperature in the range of 200° C. to 600° C., sintering is performed in a reducing atmosphere at a temperature in the range of 1200° C. to 1550° C. The reducing atmosphere is mainly composed of a mixed gas of hydrogen ($H_2$) and nitrogen ($N_2$). The volume ratio of hydrogen to nitrogen may be in the range of $H_2:N_2=1:99$ to $H_2:N_2=10:90$. The mixed gas may contain oxygen. The oxygen concentration is $10^{-12}$ Pa or more and $10^{-4}$ Pa or less, preferably $10^{-8}$ Pa or more and $10^{-8}$ Pa or less. The oxygen concentration can be measured with a zirconia-type oxygen sensor. A multilayered piezoelectric element according to an embodiment of the present invention can be manufactured using a Ni electrode at low cost. After firing in the reducing atmosphere and cooling to 600° C., the atmosphere may be changed to the ambient atmosphere (oxidizing atmosphere) to perform oxidation treatment. After the multilayered piezoelectric element is removed from the furnace, an electrically conductive paste is applied to a side surface of the multilayered piezoelectric element on which ends of the internal electrodes are exposed. The electrically conductive paste is then dried to form an external electrode.

(Liquid Discharge Head)

A liquid discharge head according to an embodiment of the present invention will be described below.

The liquid discharge head includes a liquid chamber and a discharge port in communication with the liquid chamber. The liquid chamber has a vibrating unit that includes a piezoelectric element or a multilayered piezoelectric element according to an embodiment of the present invention.

Figure 3A:
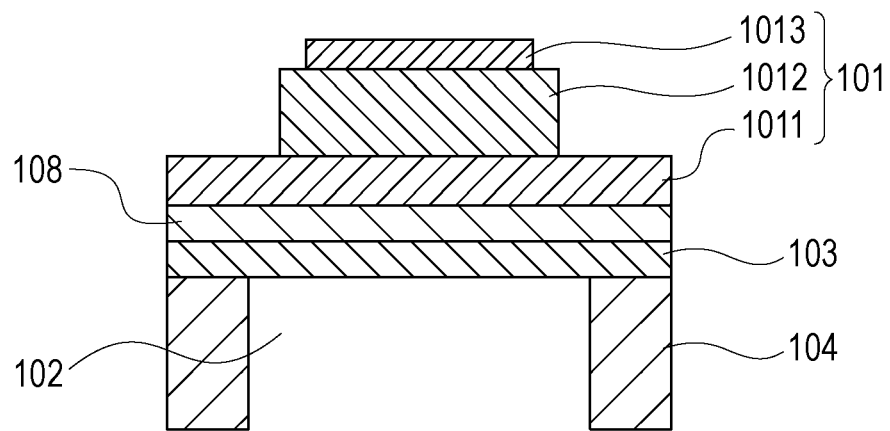
FIG. 3A is a schematic view of a liquid discharge head according to an embodiment of the present invention.
Figure 3B:
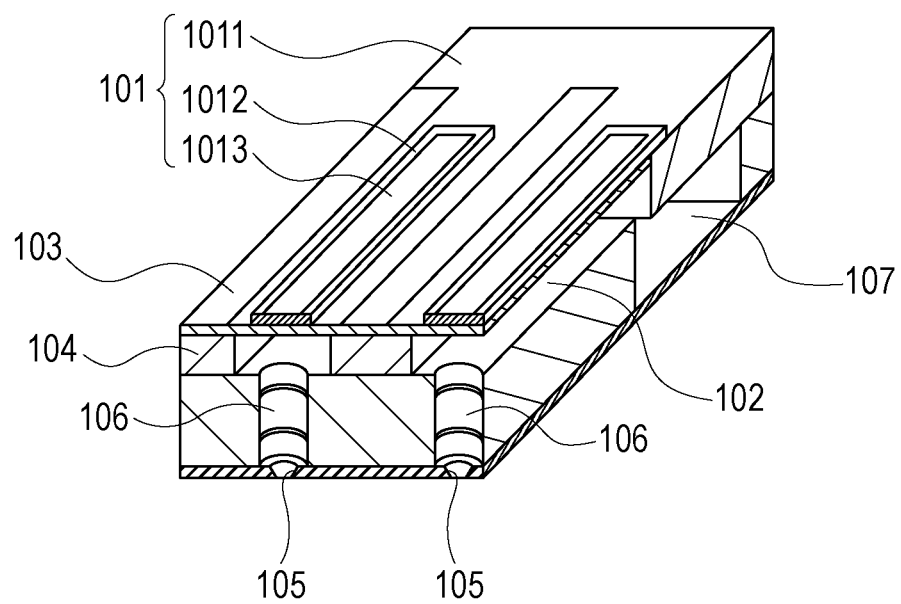
FIG. 3B is a schematic perspective view of the liquid discharge head illustrated in FIG. 3A.

FIG. 3A is a schematic view of a liquid discharge head according to an embodiment of the present invention. FIG. 3B is a schematic perspective view of the liquid discharge head illustrated in FIG. 3A. As illustrated in FIGS. 3A and 3B, the liquid discharge head includes a piezoelectric element 101 according to an embodiment of the present invention. The piezoelectric element 101 includes a first electrode 1011, a piezoelectric material 1012, and a second electrode 1013. As illustrated in FIG. 3B, the piezoelectric material 1012 may be patterned.

FIG. 3B is a schematic view of a liquid discharge head. The liquid discharge head includes a discharge port 105, an individual liquid chamber 102, a communicating hole 106 that connects the individual liquid chamber 102 to the discharge port 105, a liquid chamber partition wall 104, a common liquid chamber 107, a diaphragm 103, and the piezoelectric element 101. Although the piezoelectric element 101 is rectangular in FIG. 3B, the piezoelectric element 101 may be of another shape, such as elliptical, circular, or parallelogrammic. In general, the piezoelectric material 1012 has a shape corresponding to the shape of the individual liquid chamber 102.

The piezoelectric element 101 of the liquid discharge head will be described in detail below with reference to FIG. 3A. FIG. 3A is a cross-sectional view of FIG. 3B in the width direction of the piezoelectric element. Although the piezoelectric element 101 has a rectangular cross section in FIG. 3A, the piezoelectric element 101 may have a trapezoidal or inverted trapezoidal cross section.

In FIG. 3A, the first electrode 1011 is a lower electrode, and the second electrode 1013 is an upper electrode. The first electrode 1011 and the second electrode 1013 may be arranged differently. For example, the first electrode 1011 may be a lower electrode or an upper electrode. Likewise, the second electrode 1013 may be an upper electrode or a lower electrode. A buffer layer 108 may be disposed between the diaphragm 103 and the lower electrode. These different designations result from variations in the method for manufacturing the device, and each of the cases has the advantages of the present invention.

In the liquid discharge head, the diaphragm 103 bends upward and downward with the expansion and contraction of the piezoelectric material 1012, thereby applying pressure to a liquid in the individual liquid chamber 102. This allows the liquid to be discharged from the discharge port 105. A liquid discharge head according to an embodiment of the present invention can be used in printers and in the manufacture of electronic equipment.

The thickness of the diaphragm 103 is 1.0 µm or more and 15 µm or less, preferably 1.5 µm or more and 8 µm or less. The material of the diaphragm is not particularly limited and may be Si. Si of the diaphragm may be doped with boron or phosphorus. The buffer layer and the electrode layer on the diaphragm may constitute the diaphragm. The buffer layer 108 has a thickness of 5 nm or more and 300 nm or less, preferably 10 nm or more and 200 nm or less. The discharge port 105 has an equivalent circular diameter of 5 µm or more and 40 µm or less. The discharge port 105 may be circular, star-shaped, square, or triangular.

(Liquid Discharge Apparatus)

A liquid discharge apparatus according to an embodiment of the present invention will be described below. The liquid discharge apparatus includes a mounting portion for a transfer medium and the liquid discharge head described above.

Figure 4:
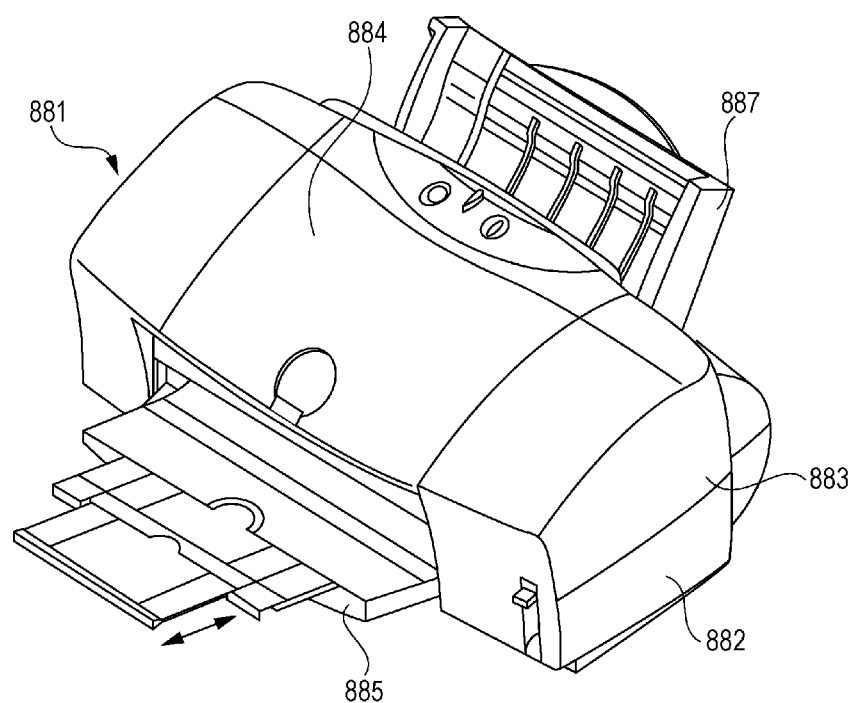
FIG. 4 is a schematic view of a liquid discharge apparatus according to an embodiment of the present invention.
Figure 5:
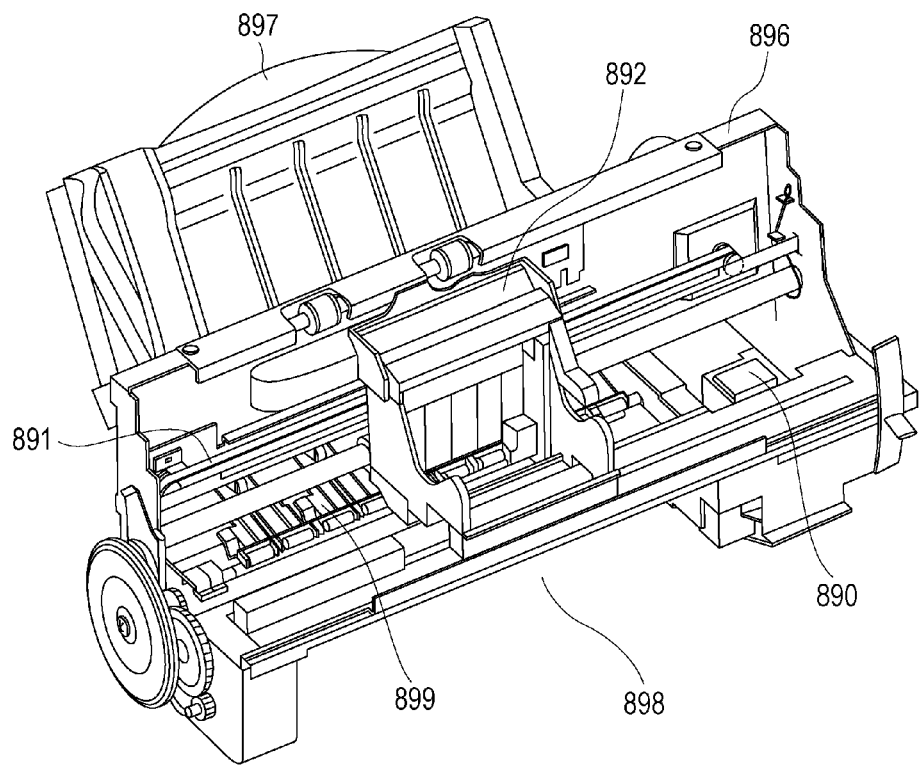
FIG. 5 is a schematic view of a liquid discharge apparatus according to an embodiment of the present invention.

The liquid discharge apparatus may be an ink jet recording apparatus, as illustrated in FIGS. 4 and 5. FIG. 5 illustrates the liquid discharge apparatus (ink jet recording apparatus) 881 illustrated in FIG. 4 without exteriors 882 to 885 and 887. The ink jet recording apparatus 881 includes an automatic feeder 897 for automatically feeding a recording paper sheet as a transfer medium to the main body 896 of the apparatus. The ink jet recording apparatus 881 further includes a conveying unit 899 for conveying a recording paper sheet, which is a mounting portion for a transfer medium, from the automatic feeder 897 to a predetermined recording position and from the recording position to an outlet 898, a recording unit 891 for recording to the recording paper at the recording position, and a recovering unit 890 for recovering the recording unit 891. The recording unit 891 includes a carriage 892 for housing a liquid discharge head according to an embodiment of the present invention. The carriage 892 travels along a rail.

In such an ink jet recording apparatus, the carriage 892 travels along a rail in response to electric signals sent from a computer. Upon the application of a driving voltage to electrodes disposed on a piezoelectric material, the piezoelectric material is deformed. Upon the deformation, the piezoelectric material presses the individual liquid chamber 102 via the diaphragm 103 illustrated in FIG. 3B, thereby discharging an ink from the discharge port 105 to print characters.

A liquid discharge apparatus according to an embodiment of the present invention can uniformly discharge a liquid at a high speed and can be reduced in size. In addition to the printer described above, a liquid discharge apparatus according to an embodiment of the present invention can be used in other ink jet recording apparatuses, such as facsimile machines, multifunction devices, and copying machines, and industrial liquid discharge apparatuses. In addition, a user can select a desired transfer medium for each application. Furthermore, a liquid discharge head may move relative to a transfer medium mounted on a stage, which serves as a mounting portion.

(Ultrasonic Motor)

An ultrasonic motor according to an embodiment of the present invention will be described below. The ultrasonic motor includes a vibrating member and a moving body in contact with the vibrating member. The vibrating member includes a piezoelectric element or a multilayered piezoelectric element according to an embodiment of the present invention.

Figure 6A:
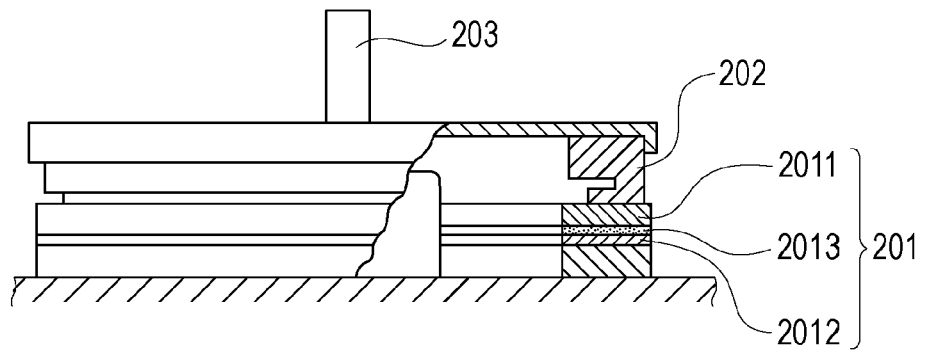
FIG. 6A is a schematic view of an ultrasonic motor according to an embodiment of the present invention.
Figure 6B:
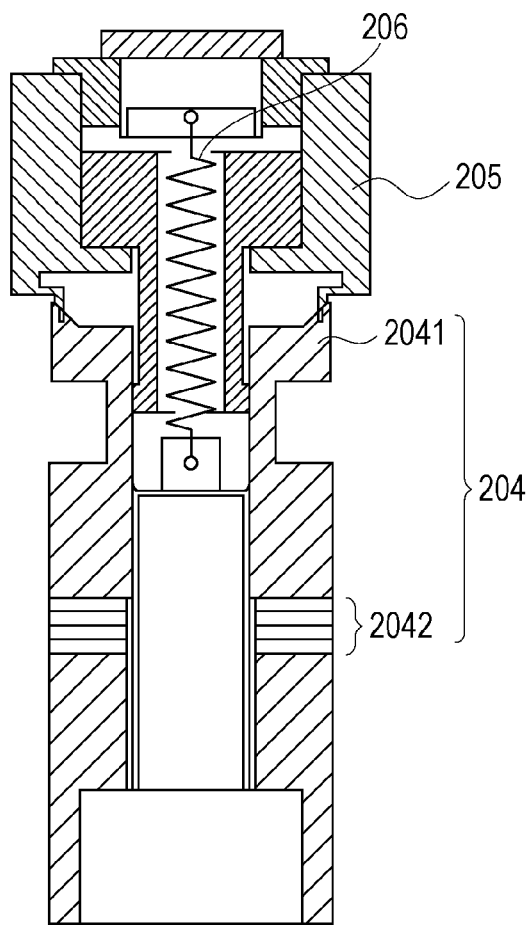
FIG. 6B is a schematic view of an ultrasonic motor according to another embodiment of the present invention.

FIG. 6A is a schematic view of an ultrasonic motor according to an embodiment of the present invention. FIG. 6B is a schematic view of an ultrasonic motor according to another embodiment of the present invention. The ultrasonic motor illustrated in FIG. 6A includes a single plate of a piezoelectric element according to an embodiment of the present invention. The ultrasonic motor includes an oscillator 201, a rotor 202 pressed against a sliding surface of the oscillator 201 by the action of a pressure spring (not shown), and an output shaft 203, which is formed integrally with the rotor 202. The oscillator 201 includes a metal elastic ring 2011, a piezoelectric element 2012 according to an embodiment of the present invention, and an organic adhesive 2013 (epoxy or cyanoacrylate) that bonds the piezoelectric element 2012 to the elastic ring 2011. Although not shown in the figure, the piezoelectric element 2012 includes a piezoelectric material between a first electrode and a second electrode.

Upon the application of two-phase alternating voltages that differ by an odd number times $\pi/2$ in phase to a piezoelectric element according to an embodiment of the present invention, a flexural traveling wave occurs in the oscillator 201, and points on the sliding surface of the oscillator 201 go through elliptical motion. The rotor 202 pressed against the sliding surface of the oscillator 201 receives friction force from the oscillator 201 and rotates in a direction opposite to the direction of the flexural traveling wave. A body to be driven (not shown) joined to the output shaft 203 is driven by the rotational force of the rotor 202.

Upon the application of a voltage to a piezoelectric material, the piezoelectric material expands and contracts because of the transverse piezoelectric effect. An elastic body, such as a metal, joined to the piezoelectric element is bent with the expansion and contraction of the piezoelectric material. The ultrasonic motor described herein utilizes this principle.

FIG. 6B illustrates an ultrasonic motor that includes a multilayered piezoelectric element. The oscillator 204 includes a multilayered piezoelectric element 2042 in a tubular metal elastic body 2041. The multilayered piezoelectric element 2042 includes a plurality of layered piezoelectric materials (not shown) and includes a first electrode and a second electrode on the outer surfaces of the layered piezoelectric materials and internal electrodes within the layered piezoelectric materials. The metal elastic body 2041 is fastened with a bolt to hold the multilayered piezoelectric element 2042, thereby constituting the oscillator 204.

Upon the application of alternating voltages of different phases to the multilayered piezoelectric element 2042, the oscillator 204 causes two oscillations perpendicular to each other. The two oscillations are synthesized to form a circular oscillation for driving the tip of the oscillator 204. The oscillator 204 has an annular groove at its upper portion. The annular groove increases the oscillatory displacement for driving.

A rotor 205 is pressed against the oscillator 204 by the action of a pressure spring 206 and receives friction force for driving. The rotor 205 is rotatably supported by a bearing.

(Optical Apparatus)

An optical apparatus according to an embodiment of the present invention will be described below. The optical apparatus includes a drive unit that includes the ultrasonic motor described above.

Figure 7A:
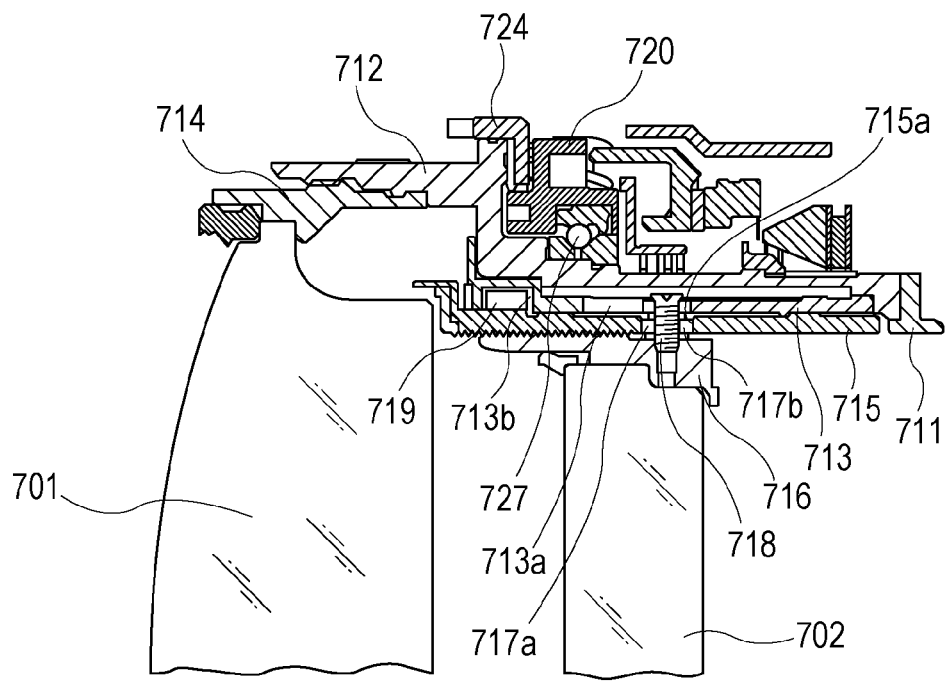
FIGS. 7A and 7B are schematic views of an optical apparatus according to an embodiment of the present invention.
Figure 7B:
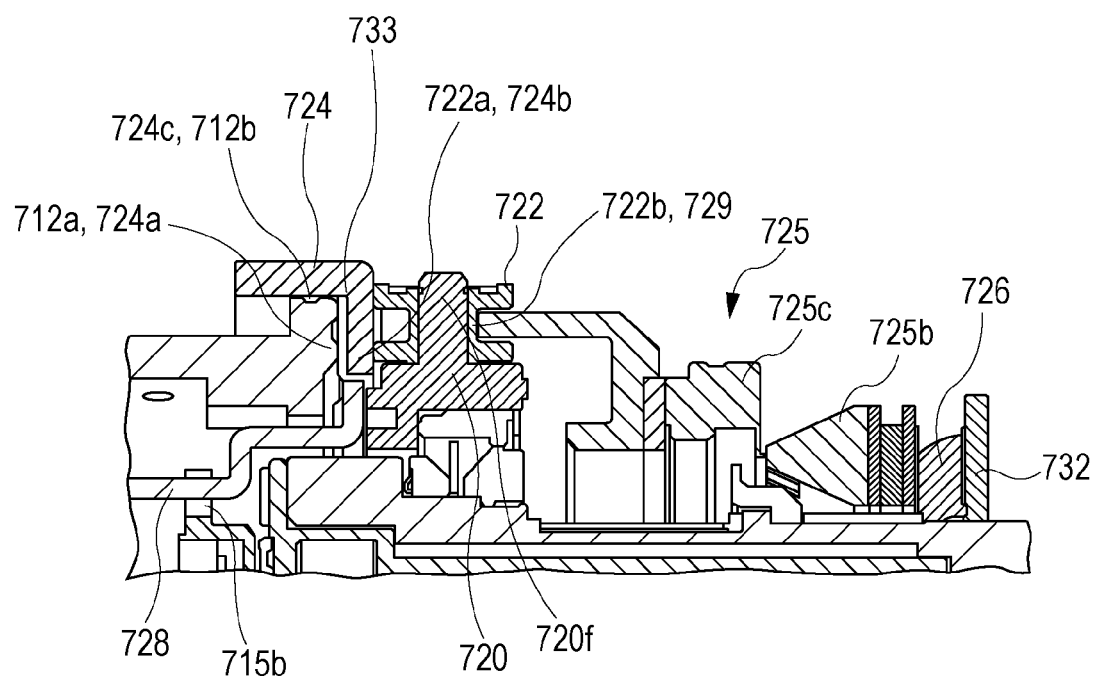
Figure 8:
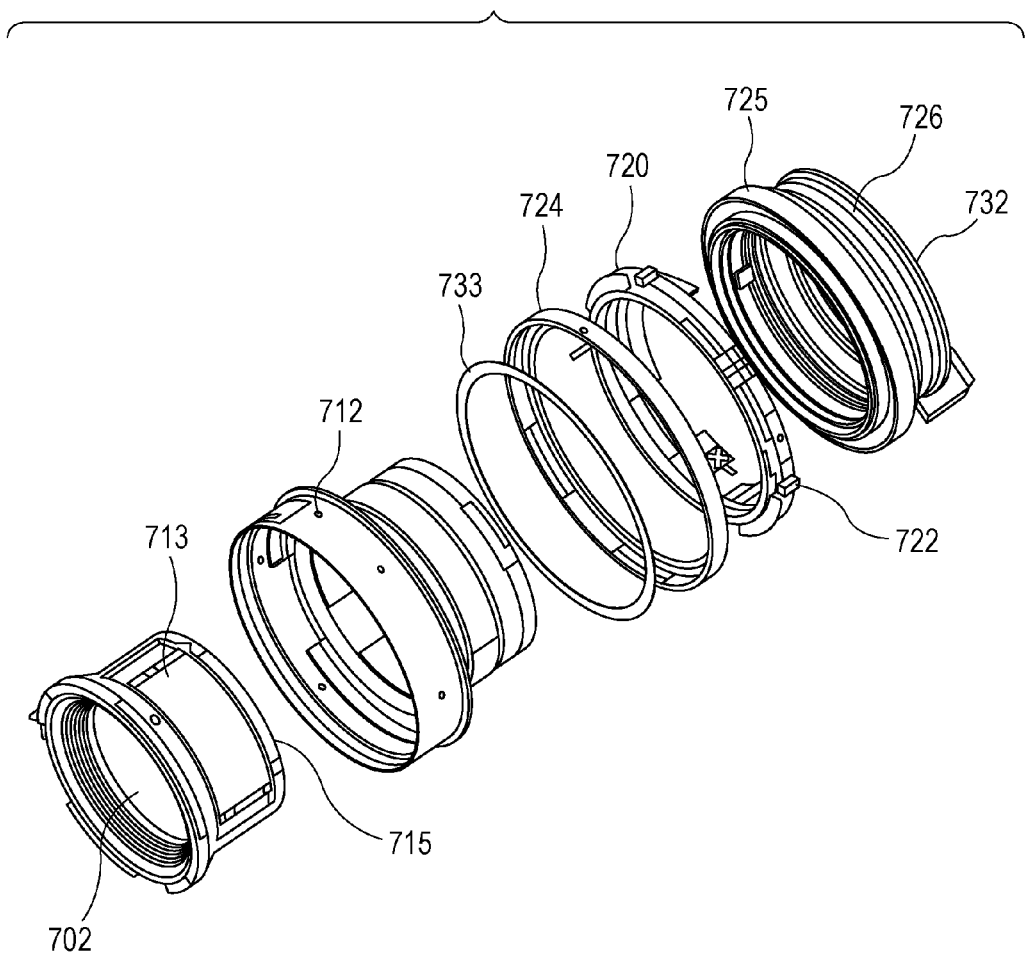
FIG. 8 is a schematic view of an optical apparatus according to an embodiment of the present invention.

FIGS. 7A and 7B are cross-sectional views of an interchangeable lens barrel of a single-lens reflex camera, which is an image pickup apparatus according to an embodiment of the present invention. FIG. 8 is an exploded perspective view of an interchangeable lens barrel of a single-lens reflex camera, which is an image pickup apparatus according to an embodiment of the present invention. A fixed barrel 712, a linear guide barrel 713, and a front lens group barrel 714 are fixed to a removable mount 711 of the camera. These components are fixed members of the interchangeable lens barrel.

The linear guide barrel 713 has a linear guide groove 713*a* for a focus lens 702 in the optical axis direction. The focus lens 702 is supported by a rear lens group barrel 716. Cam rollers 717*a* and 717*b* protruding outwardly in the radial direction are fixed to the rear lens group barrel 716 with a screw 718. The cam roller 717*a* fits in the linear guide groove 713*a*.

A cam ring 715 rotatably fits in the internal circumference of the linear guide barrel 713. A roller 719 fixed to the cam ring 715 is caught in an annular groove 713*b* of the linear guide barrel 713, thereby restricting the relative displacement of the linear guide barrel 713 and the cam ring 715 in the optical axis direction. The cam ring 715 has a cam groove 715*a* for the focus lens 702. The cam roller 717*b* also fits in the cam groove 715*a*.

A rotation transmitting ring 720 is rotatably held by a ball race 727 at a fixed position on the periphery of the fixed barrel 712. A driven roller 722 is rotatably held by a shaft 720*f* extending radially from the rotation transmitting ring 720. A large-diameter portion 722*a* of the driven roller 722 is in contact with a mount side end face 724*b* of a manual focus ring 724. A small-diameter portion 722*b* of the driven roller 722 is in contact with a joint 729. Six driven rollers 722 are disposed at regular intervals on the periphery of the rotation transmitting ring 720. Each of the driven rollers 722 satisfies the structural relationship described above.

A low-friction sheet (washer member) 733 is disposed on the inside of the manual focus ring 724. The low-friction sheet 733 is disposed between a mount side end face 712*a* of the fixed barrel 712 and a front end face 724*a* of the manual focus ring 724. The low-friction sheet 733 has a circular outer surface having a diameter that fits to the inner diameter 724*c* of the manual focus ring 724. The inner diameter 724*c* of the manual focus ring 724 fits to the diameter of an outer portion 712*b* of the fixed barrel 712. The low-friction sheet 733 can reduce friction in the rotating ring mechanism in which the manual focus ring 724 rotates about the optical axis relative to the fixed barrel 712.

The large-diameter portion 722*a* of the driven roller 722 is pressed against the mount side end face 724*b* of the manual focus ring because the wave washer 726 presses the ultrasonic motor 725 forward to the front of the lens. Likewise, because the wave washer 726 presses the ultrasonic motor 725 forward to the front of the lens, the small-diameter portion 722*b* of the driven roller 722 is pressed against the joint 729. The wave washer 726 is prevented from moving toward the mount by a washer 732 bayonet coupled to the fixed barrel 712. The spring force (impellent force) of the wave washer 726 is transmitted to the ultrasonic motor 725 and the driven roller 722 and furthermore presses the manual focus ring 724 against the mount side end face 712*a* of the fixed barrel 712. In other words, the manual focus ring 724 is pressed against the mount side end face 712*a* of the fixed barrel 712 via the low-friction sheet 733.

Thus, when the ultrasonic motor 725 is rotated by a control unit (not shown) relative to the fixed barrel 712, the driven roller 722 rotates about the shaft 720*f* because the joint 729 is in frictional contact with the small-diameter portion 722*b* of the driven roller 722. The rotation of the driven roller 722 about the shaft 720*f* causes the rotation of the rotation transmitting ring 720 about the optical axis (automatic focusing).

When a manual input unit (not shown) provides the manual focus ring 724 with rotational force about the optical axis, since the mount side end face 724*b* of the manual focus ring 724 is pressed against the large-diameter portion 722*a* of the driven roller 722, the driven roller 722 is rotated about the shaft 720*f* because of friction force. The rotation of the large-diameter portion 722*a* of the driven roller 722 about the shaft 720*f* causes the rotation of the rotation transmitting ring 720 about the optical axis. However, the ultrasonic motor 725 is not rotated because of the friction force between a rotor 725*c* and a stator 725*b* (manual focusing).

The rotation transmitting ring 720 is provided with two focus keys 728 facing each other. These focus keys 728 fit into notches 715*b* at the tip of the cam ring 715. Upon automatic focusing or manual focusing, the rotation transmitting ring 720 is rotated about the optical axis, and the rotational force is transmitted to the cam ring 715 via the focus keys 728. When the cam ring 715 is rotated about the optical axis, the cam roller 717*b* moves the cam roller 717*a* and the rear group lens barrel 716 restricted by the linear guide groove 713*a* forward or backward along the cam groove 715*a* of the cam ring 715. This drives the focus lens 702 and allows focusing.

Although an optical apparatus according to an embodiment of the present invention has been described with reference to an interchangeable lens barrel of a single-lens reflex camera, the optical apparatus may also be applied to optical apparatuses that include an ultrasonic motor in a drive unit, for example, cameras, such as compact cameras and electronic still cameras.

(Vibratory Apparatus and Dust Removing Device)

vibratory apparatuses for conveying or removing particles, powders, and droplets are widely used in electronic equipment. As an example of a vibratory apparatus according to the present invention, a dust removing device that includes a piezoelectric element according to an embodiment of the present invention will be described below.

The dust removing device includes a vibrating member that includes a piezoelectric element or a multilayered piezoelectric element according to an embodiment of the present invention on a diaphragm.

Figure 9A:
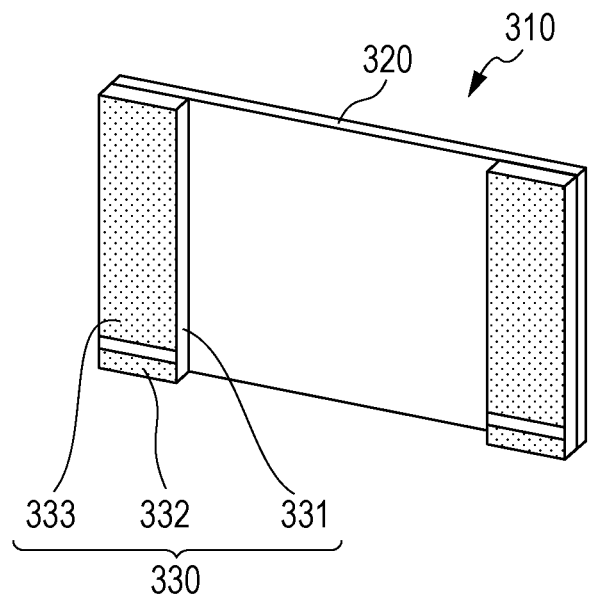
FIGS. 9A and 9B are schematic views of a dust removing device including a vibratory apparatus according to an embodiment of the present invention.
Figure 9B:
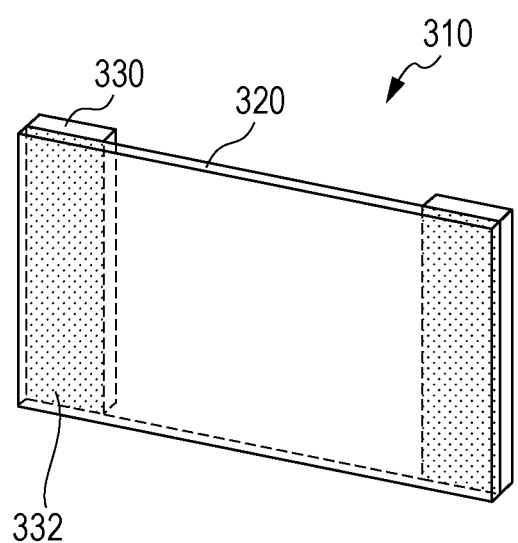

FIGS. 9A and 9B are schematic views of a dust removing device 310 according to an embodiment of the present invention. The dust removing device 310 includes a plate of the piezoelectric element 330 and the diaphragm 320. The piezoelectric element 330 may be a multilayered piezoelectric element according to an embodiment of the present invention. The diaphragm 320 may be made of any material. When the dust removing device 310 is used in optical devices, the diaphragm 320 may be made of a translucent or transparent material or a light reflective material.

Figure 10A:
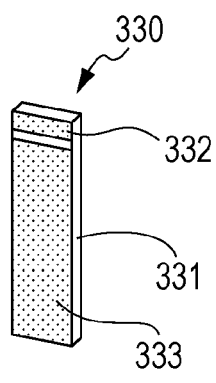
FIG. 10A is a schematic perspective view of a piezoelectric element of a dust removing device according to an embodiment of the present invention.
Figure 10B:
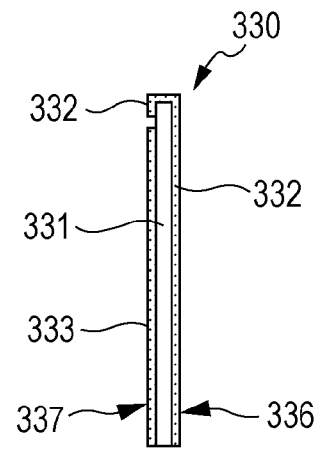
FIG. 10B is a side view of the piezoelectric element illustrated in FIG. 10A.
Figure 10C:
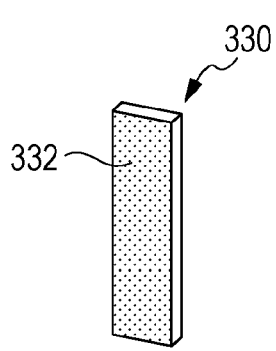
FIG. 10C is a schematic perspective view of the piezoelectric element illustrated in FIG. 10A.

FIGS. 10A to 10C are schematic views of the piezoelectric element 330 illustrated in FIGS. 9A and 9B. FIGS. 10A and 10C illustrate the front and back sides of the piezoelectric element 330. FIG. 10B is a side view of the piezoelectric element 330. As illustrated in FIGS. 9A and 9B, the piezoelectric element 330 includes a piezoelectric material 331, a first electrode 332, and a second electrode 333. The first electrode 332 and the second electrode 333 are disposed on opposite sides of the piezoelectric material 331. As in FIGS. 9A and 9B, the piezoelectric element 330 may be a multilayered piezoelectric element according to an embodiment of the present invention. In this case, the piezoelectric material 331 includes piezoelectric material layers and internal electrodes alternately stacked on top of one another. The internal electrodes are alternately connected to the first electrode 332 and the second electrode 333, thereby allowing the piezoelectric material layers to alternately have a drive waveform of a different phase. As illustrated in FIG. 10C, a surface of the piezoelectric element 330 on which the first electrode 332 is disposed is referred to as a first electrode surface 336. As illustrated in FIG. 10A, a surface of the piezoelectric element 330 on which the second electrode 333 is disposed is referred to as a second electrode surface 337.

The term "electrode surface", as used herein, refers to a surface of a piezoelectric element on which an electrode is disposed. For example, as illustrated in FIG. 10B, the first electrode 332 may round a corner and extends to the second electrode surface 337.

As illustrated in FIGS. 9A and 9B, the first electrode surface 336 of the piezoelectric element 330 is bonded to the diaphragm 320. Actuation of the piezoelectric element 330 produces a stress between the piezoelectric element 330 and the diaphragm 320, causing out-of-plane oscillations on the diaphragm 320. The dust removing device 310 removes foreign matter, such as dust, on the diaphragm 320 by the action of out-of-plane oscillations. The term "out-of-plane oscillations", as used herein, refers to elastic oscillations that cause displacements of a diaphragm in the optical axis direction or the diaphragm thickness direction.

Figure 11A:
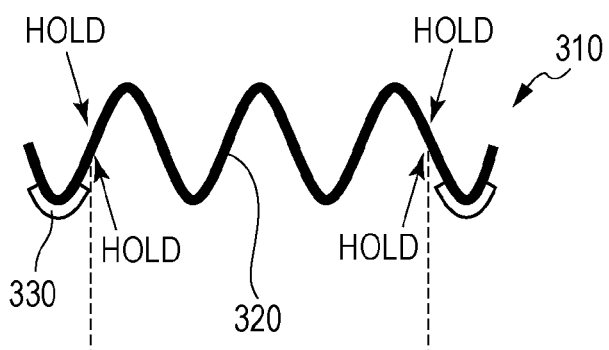
FIGS. 11A and 11B are schematic views illustrating the vibration principle of a dust removing device according to an embodiment of the present invention.
Figure 11B:
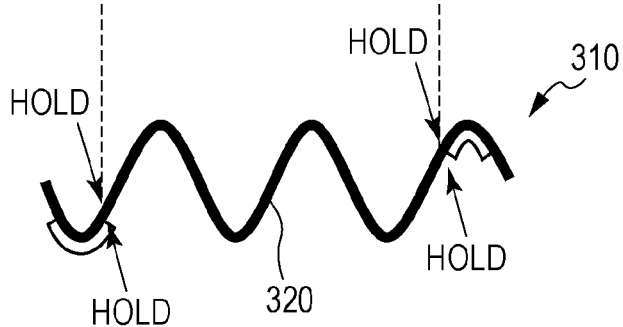

FIGS. 11A and 11B are schematic views illustrating the vibration principle of a dust removing device 310 according to an embodiment of the present invention. In FIG. 11A, an in-phase alternating electric voltage is applied to a left-and-right pair of the piezoelectric elements 330 to cause out-of-plane oscillations of the diaphragm 320. The direction of polarization of the piezoelectric material constituting the left-and-right pair of the piezoelectric elements 330 is the same as the thickness direction of the piezoelectric elements 330. The dust removing device 310 is driven in a seventh oscillation mode. In FIG. 11B, an anti-phase alternating voltage is applied to a left-and-right pair of the piezoelectric elements 330 to cause out-of-plane oscillations of the diaphragm 320. The dust removing device 310 is driven in a sixth oscillation mode. The dust removing device 310 can employ at least two oscillation modes to effectively remove dust on the surface of the diaphragm.

(Image Pickup Apparatus)

Figure 12:
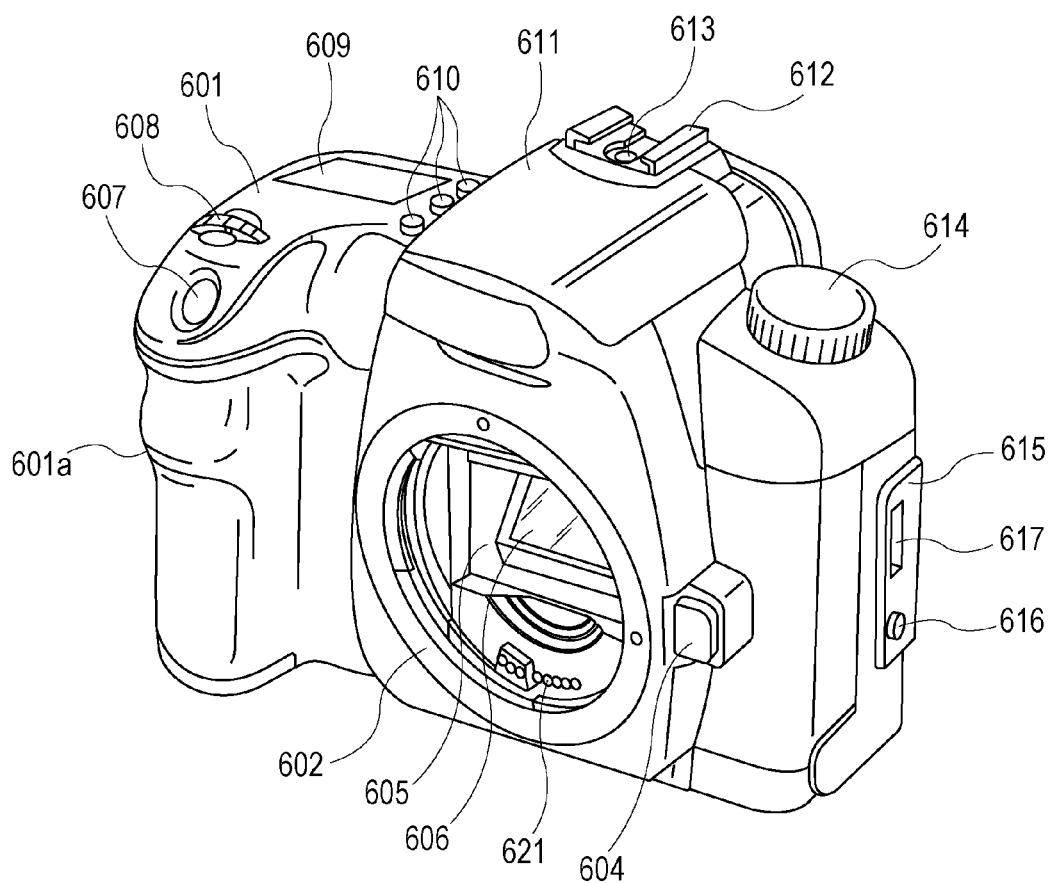
FIG. 12 is a schematic view of an image pickup apparatus according to an embodiment of the present invention.
Figure 13:
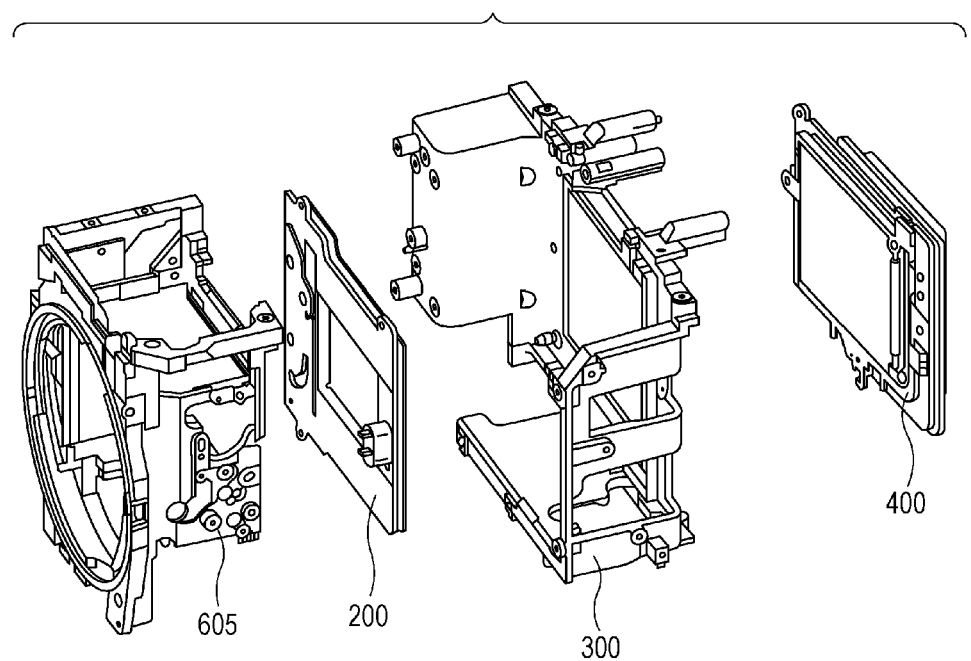
FIG. 13 is a schematic view of an image pickup apparatus according to an embodiment of the present invention.

An image pickup apparatus according to an embodiment of the present invention will be described below. The image pickup apparatus includes a dust removing device according to an embodiment of the present invention and an image pickup element unit, wherein the dust removing device includes a diaphragm on a light-receiving surface of the image pickup element unit. FIGS. 12 and 13 illustrate a digital single-lens reflex camera, which is an image pickup apparatus according to an embodiment of the present invention.

FIG. 12 is a front perspective view of the main body 601 of the camera viewed from the object side. An imaging lens unit has been removed. FIG. 13 is an exploded perspective view of the inside of the camera, illustrating surrounding structures of a dust removing device according to an embodiment of the present invention and an image pickup element unit 400.

The main body 601 of the camera includes a mirror box 605 to which an image light beam passing through an imaging lens is directed. The mirror box 605 includes a main mirror (quick return mirror) 606. The main mirror 606 can make an angle of 45 degrees with the optical axis to direct an image light beam to a penta roof mirror (not shown) or may avoid the image light beam in order to direct the image light beam to an image pickup element (not shown).

The mirror box 605 and a shutter unit 200 are disposed in front of a main body chassis 300 of the main body 601 of the camera in this order from the object side. The image pickup element unit 400 is disposed on the photographer side of the main body chassis 300. The image pickup element unit 400 is installed such that an image pickup surface of the image pickup element is disposed at a predetermined distance from and parallel to the surface of a mount 602 to which an imaging lens unit is to be attached.

Although the digital single-lens reflex camera has been described as an image pickup apparatus according to an embodiment of the present invention, the image pickup apparatus may be an interchangeable-lens camera, such as a mirrorless digital interchangeable-lens camera without the mirror box 605. Among various image pickup apparatuses and electrical and electronic equipment that include image pickup apparatuses, such as interchangeable-lens video cameras, copying machines, facsimile machines, and scanners, an image pickup apparatus according to an embodiment of the present invention can particularly be applied to devices that require the removal of dust deposited on a surface of an optical component.

(Electronic Equipment)

Electronic equipment according to an embodiment of the present invention will be described below. The electronic equipment includes a piezoelectric acoustic component that includes a piezoelectric element or a multilayered piezoelectric element according to an embodiment of the present invention.

Figure 14:
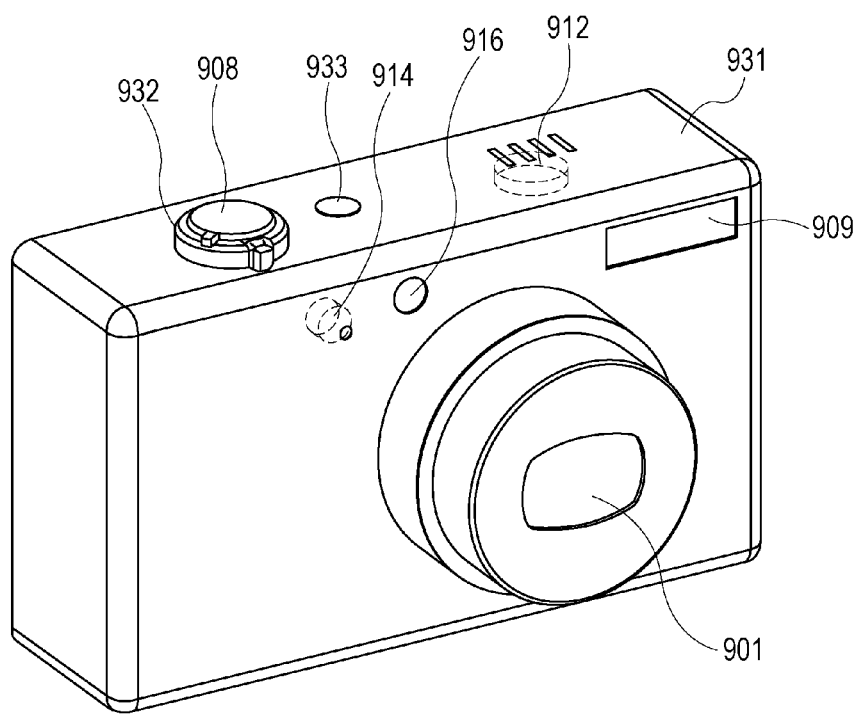
FIG. 14 is a schematic view of electronic equipment according to an embodiment of the present invention.

FIG. 14 is a perspective view of the main body 931 of a digital camera, which is electronic equipment according to an embodiment of the present invention. An optical device 901, a microphone 914, an electronic flash unit 909, and a fill light unit 916 are disposed on the front surface of the main body 931. The microphone 914 is disposed within the main body and is indicated by a broken line. An opening for catching external sound is disposed in front of the microphone 914.

A power switch 933, a loudspeaker 912, a zoom lever 932, and a release button 908 for focusing are disposed on the top surface of the main body 931. The loudspeaker 912 is disposed within the main body 931 and is indicated by a broken line. An opening for transmitting sound to the outside is disposed in front of the loudspeaker 912.

The piezoelectric acoustic component may be used in at least one of the microphone 914 and the loudspeaker 912. The piezoelectric acoustic component also includes a surface acoustic wave filter (SAW filter).

Although the digital camera has been described as electronic equipment according to an embodiment of the present invention, the electronic equipment may also be applied to electronic equipment that includes a piezoelectric acoustic component, such as audio-reproducing devices, audio-recording devices, mobile phones, and information terminals.

A piezoelectric material according to an embodiment of the present invention has a high and stable piezoelectric constant and mechanical quality factor in a wide operating temperature range. The piezoelectric material contains no lead and can reduce the load on the environment. Thus, the piezoelectric material can be used without problems for apparatuses manufactured using a large amount of piezoelectric material, such as liquid discharge heads, liquid discharge apparatuses, ultrasonic motors, optical apparatuses, vibratory apparatuses, dust removing devices, image pickup apparatuses, and electronic equipment.

EXAMPLES

Although the present invention is further described in the following examples, the present invention is not limited to these examples.

A piezoelectric material according to an embodiment of the present invention was produced.
(Piezoelectric Material)
(Piezoelectric Material According to Example 1)

A raw material having the composition $(Ba_{0.845}Ca_{0.155})_{1.004}(Ti_{0.942}Sn_{0.008}Zr_{0.050})O_3$, which is represented by the general formula $(Ba_{1-x}Ca_x)_a(Ti_{1-y-z}Sn_yZr_z)O_3$, wherein x=0.155, y=0.008, z=0.050, and a=1.004, was weighed as described below.

Raw powders of barium titanate having an average particle size of 100 nm and a purity of 99.999% or more, calcium titanate having an average particle size of 300 nm and a purity of 99.999% or more, calcium zirconate having an average particle size of 300 nm and a purity of 99.999% or more, and barium stannate having an average particle size of 500 nm and a purity of 99.999% or more were produced by a solid phase method. These barium titanate, calcium titanate, calcium zirconate, and barium stannate were weighed at a molar ratio of 81.7:10.5:5.0:0.8. The value a representing the ratio of the number of moles of Ba and Ca at the A site to the number of moles of Ti, Sn, and Zr at the B site was controlled with barium oxalate. These weighed powders were dry-blended in a ball mill for 24 hours. In order to granulate the mixed powder, an amount of manganese (II) acetate corresponding to 0.18 parts by weight of Mn on a metal basis and 3 parts by weight of a PVA binder per 100 parts by weight of the mixed powder were deposited on the surface of the mixed powder with a spray drier.

The resulting granulated powder was charged in a mold and was pressed at 200 MPa with a pressing machine to form a discoidal compact. A non-magnesium mold release agent had been applied to the surface of the mold. This compact could be further pressed with a cold isostatic pressing machine, and the further pressed compact had the same results.

The compact was held in an electric furnace at the maximum temperature of 1380° C. for 5 hours and was sintered in the ambient atmosphere for 24 hours in total, yielding a ceramic piezoelectric material according to an embodiment of the present invention.

The average equivalent circular diameter and relative density of crystal grains of the piezoelectric ceramic were measured. The average equivalent circular diameter was 2.2 μm, and the relative density was 98.3%. The crystal grains were observed mainly with a polarizing microscope. A small crystal grain size was determined with a scanning electron microscope (SEM). The average equivalent circular diameter was determined from this observation. The relative density was measurement in accordance with Archimedes' principle.

The piezoelectric ceramic was polished to a thickness of 0.5 mm, and the crystal structure of the piezoelectric material was analyzed by X-ray diffraction. Only peaks corresponding to a perovskite type structure were observed.

The composition of the material was determined by X-ray fluorescence spectroscopy. The results showed that the piezoelectric material was mainly composed of a metal oxide having the chemical formula $(Ba_{0.845}Ca_{0.155})_{1.004}(Ti_{0.942}Sn_{0.008}Zr_{0.050})O_3$ and contained 0.18 parts by weight of Mn and 0.0001 parts by weight of Mg per 100 parts by weight of the main component. The Mg component was probably derived from the high-purity raw materials. With respect to the other metal components, the weighed composition agreed with the composition after sintering. Elements other than Ba, Ca, Ti, Sn, Zr, Mn, and Mg were below the detection limits. Sintering or polishing did not significantly change the average equivalent circular diameter.
(Piezoelectric Materials According to Examples 2 to 23)

Barium titanate, calcium titanate, calcium zirconate, and barium stannate used in Example 1 were weighed at a molar ratio listed in Table 1. In order to control the value a representing the ratio of the number of moles of Ba and Ca at the A site to the number of moles of Ti, Sn, and Zr at the B site, barium oxalate was weighed as listed in Table 1. These weighed powders were dry-blended in a ball mill for 24 hours. In order to granulate the mixed powder, an amount of manganese (II) acetate corresponding to the Mn weight on a metal basis listed in Table 1 and 3 parts by weight of a PVA binder per 100 parts by weight of the mixed powder were deposited on the surface of the mixed powder with a spray drier. In Examples 20 to 23, amounts of magnesium oxide corresponding to 0.0049, 0.0099, 0.0499, and 0.0999 parts by weight of Mg on a metal basis, respectively, were mixed.

A granulated powder prepared in the same manner as in Example 1 was charged in a mold and was pressed at 200 MPa with a pressing machine to form a discoidal compact. A non-magnesium mold release agent had been applied to the surface of the mold. This compact could be further pressed with a cold isostatic pressing machine, and the further pressed compact had the same results.

The compact was held in an electric furnace at the maximum temperature of 1380° C. for 5 hours and was sintered in the ambient atmosphere for 24 hours in total, yielding a ceramic piezoelectric material according to an embodiment of the present invention.

The average equivalent circular diameter and relative density of crystal grains of the piezoelectric ceramic were measured in the same manner as in Example 1. Table 2 shows the results.

In the same manner as in Example 1, the piezoelectric ceramic was polished to a thickness of 0.5 mm, and the crystal structure of the piezoelectric material was analyzed by X-ray diffraction. Only peaks corresponding to a perovskite type structure were observed in any of the samples.

The composition of the piezoelectric material was determined by X-ray fluorescence spectroscopy in the same manner as in Example 1. Table 3 shows the results. Auxiliary component elements other than Ba, Ca, Ti, Sn, Zr, Mn, and Mg were below the detection limits. Examples 2 to 19 contained 0.0001 parts by weight of Mg, and Examples 20 to 23 contained 0.0050, 0.0100, 0.0500, and 0.1000 parts by weight of Mg, respectively. In any of the samples, the weighed composition agreed with the composition after sintering.

When the crystal grains were observed again, the size and state of the crystal grains were substantially unchanged by sintering or polishing.

(Piezoelectric Materials According to Comparative Examples 1 to 7)

In the same manner as in Examples 1 to 23, the main components were weighed at a molar ratio listed in Table 1 and were dry-blended in a ball mill for 24 hours. In order to granulate the mixed powder, an amount of manganese (II) acetate corresponding to the Mn weight on a metal basis listed in Table 1 and 3 parts by weight of a PVA binder per 100 parts by weight of the mixed powder were deposited on the surface of the mixed powder with a spray drier. In Comparative Example 9, an amount of magnesium oxide corresponding to 0.4999 parts by weight of Mg on a metal basis was mixed as an auxiliary component.

The granulated powder was used to produce a ceramic piezoelectric material under the same conditions as in Examples 1 to 23. The average equivalent circular diameter and relative density of crystal grains of the ceramic were measured. Table 2 shows the results. The crystal grains and the relative density were evaluated in the same manner as in Examples 1 to 23.

The piezoelectric ceramic was polished to a thickness of 0.5 mm, and the crystal structure of the piezoelectric material was analyzed by X-ray diffraction. Only peaks corresponding to a perovskite structure were observed in any of the samples.

The composition of the material was determined by X-ray fluorescence spectroscopy. Table 3 shows the results. Auxiliary component elements other than Ba, Ca, Ti, Sn, Zr, Mn, and Mg were below the detection limits. Comparative Examples 1 to 6 contained 0.0001 parts by weight of Mg, and Comparative Example 7 contained 0.5000 parts by weight of Mg. In any of the samples, the weighed composition agreed with the composition after sintering.

Figure 15:
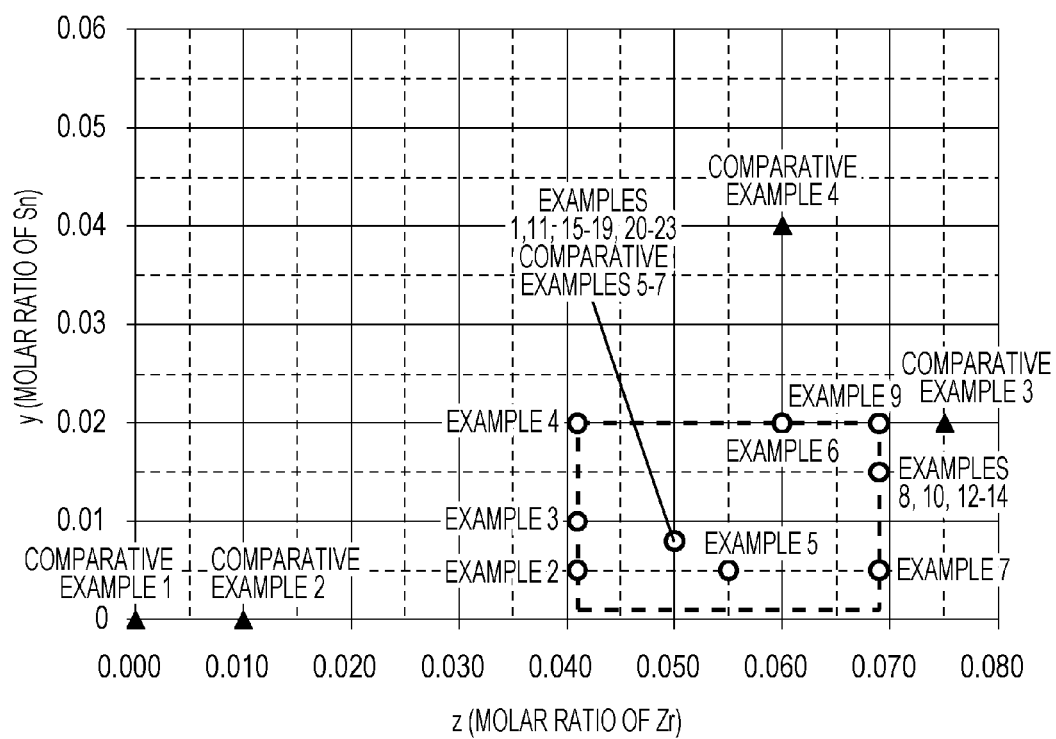
FIG. 15 is a phase diagram illustrating the relationship between the y-values and the z-values of piezoelectric materials according to Examples 1 to 23 and Comparative Examples 1 to 7 of the present invention. The y-values and the z-values surrounded by the dotted line are within the scope of claim 1.

FIG. 15 shows the relationship between the y value and the z value of the piezoelectric materials according to Examples 1 to 23 and Comparative Examples 1 to 7. A region surrounded by the dotted line indicates the ranges of y and z in the general formula (1), which represents the perovskite type metal oxide.

TABLE 1

| | $BaTiO_3$ [mol] | $CaTiO_3$ [mol] | $CaZrO_3$ [mol] | $BaSnO_3$ [mol] | $BaC_2O_4$ [mol] | Added Mn [parts by weight] |
|---|---|---|---|---|---|---|
| Example 1 | 83.7 | 10.5 | 5.0 | 0.8 | 0.014 | 0.18 |
| Example 2 | 84.0 | 11.4 | 4.1 | 0.5 | 0.018 | 0.18 |
| Example 3 | 83.5 | 11.4 | 4.1 | 1.0 | 0.015 | 0.18 |
| Example 4 | 82.5 | 11.4 | 4.1 | 2.0 | 0.019 | 0.18 |
| Example 5 | 84.0 | 10.0 | 5.5 | 0.5 | 0.017 | 0.18 |
| Example 6 | 82.5 | 9.5 | 6.0 | 2.0 | 0.017 | 0.18 |
| Example 7 | 84.0 | 8.6 | 6.9 | 0.5 | 0.018 | 0.18 |
| Example 8 | 83.0 | 8.6 | 6.9 | 1.5 | 0.019 | 0.18 |
| Example 9 | 82.5 | 8.6 | 6.9 | 2.0 | 0.015 | 0.18 |
| Example 10 | 86.0 | 5.6 | 6.9 | 1.5 | 0.014 | 0.18 |
| Example 11 | 81.2 | 13.0 | 5.0 | 0.8 | 0.014 | 0.18 |
| Example 12 | 80.5 | 11.1 | 6.9 | 1.5 | 0.019 | 0.18 |
| Example 13 | 74.5 | 17.1 | 6.9 | 1.5 | 0.019 | 0.18 |
| Example 14 | 68.5 | 23.1 | 6.9 | 1.5 | 0.020 | 0.18 |
| Example 15 | 81.2 | 13.0 | 5.0 | 0.8 | 0.011 | 0.12 |
| Example 16 | 81.2 | 13.0 | 5.0 | 0.8 | 0.018 | 0.24 |
| Example 17 | 81.2 | 13.0 | 5.0 | 0.8 | 0.020 | 0.30 |
| Example 18 | 81.2 | 13.0 | 5.0 | 0.8 | 0.025 | 0.36 |
| Example 19 | 81.2 | 13.0 | 5.0 | 0.8 | 0.023 | 0.40 |
| Example 20 | 81.2 | 13.0 | 5.0 | 0.8 | 0.015 | 0.18 |
| Example 21 | 81.2 | 13.0 | 5.0 | 0.8 | 0.019 | 0.18 |
| Example 22 | 81.2 | 13.0 | 5.0 | 0.8 | 0.015 | 0.18 |
| Example 23 | 81.2 | 13.0 | 5.0 | 0.8 | 0.014 | 0.18 |
| Comparative example 1 | 84.5 | 15.5 | 0.0 | 0.0 | 0.003 | 0.18 |
| Comparative example 2 | 84.5 | 14.5 | 1.0 | 0.0 | 0.015 | 0.18 |
| Comparative example 3 | 82.5 | 8.0 | 7.5 | 2.0 | 0.013 | 0.18 |
| Comparative example 4 | 80.5 | 9.5 | 6.0 | 4.0 | 0.013 | 0.18 |
| Comparative example 5 | 81.2 | 13.0 | 5.0 | 0.8 | 0.014 | 0.06 |
| Comparative example 6 | 81.2 | 13.0 | 5.0 | 0.8 | 0.025 | 0.42 |
| Comparative example 7 | 81.2 | 13.0 | 5.0 | 0.8 | 0.010 | 0.18 |

TABLE 2

| | Average equivalent circular diameter [μm] | Relative density [%] |
|---|---|---|
| Example 1 | 2.2 | 98.3 |
| Example 2 | 3.5 | 94.2 |
| Example 3 | 3.0 | 93.5 |
| Example 4 | 2.0 | 95.9 |
| Example 5 | 3.6 | 93.8 |
| Example 6 | 2.9 | 96.3 |
| Example 7 | 4.0 | 96.0 |
| Example 8 | 6.9 | 93.8 |
| Example 9 | 6.8 | 94.5 |
| Example 10 | 6.2 | 96.9 |
| Example 11 | 6.2 | 97.1 |
| Example 12 | 3.1 | 96.6 |
| Example 13 | 5.4 | 95.2 |
| Example 14 | 4.8 | 94.2 |
| Example 15 | 4.8 | 96.5 |
| Example 16 | 9.0 | 98.6 |
| Example 17 | 2.3 | 99.0 |
| Example 18 | 8.3 | 96.3 |
| Example 19 | 7.6 | 96.7 |
| Example 20 | 6.6 | 98.0 |
| Example 21 | 5.7 | 98.3 |
| Example 22 | 4.9 | 98.5 |
| Example 23 | 3.6 | 98.2 |
| Comparative example 1 | 133.0 | 95.3 |
| Comparative example 2 | 4.3 | 98.1 |

TABLE 2-continued

| | Average equivalent circular diameter [μm] | Relative density [%] |
|---|---|---|
| Comparative example 3 | 8.5 | 94.1 |
| Comparative example 4 | 5.6 | 95.6 |
| Comparative example 5 | 5.2 | 98.3 |
| Comparative example 6 | 9.5 | 94.2 |
| Comparative example 7 | 9.0 | 93.5 |

TABLE 3

| | x | y | z | a | Mn content [parts by weight] |
|---|---|---|---|---|---|
| Example 1 | 0.155 | 0.008 | 0.050 | 1.004 | 0.18 |
| Example 2 | 0.155 | 0.005 | 0.041 | 1.008 | 0.18 |
| Example 3 | 0.155 | 0.010 | 0.041 | 1.005 | 0.18 |
| Example 4 | 0.155 | 0.020 | 0.041 | 1.009 | 0.18 |
| Example 5 | 0.155 | 0.005 | 0.055 | 1.007 | 0.18 |
| Example 6 | 0.155 | 0.020 | 0.060 | 1.007 | 0.18 |
| Example 7 | 0.155 | 0.005 | 0.069 | 1.008 | 0.18 |
| Example 8 | 0.155 | 0.015 | 0.069 | 1.009 | 0.18 |
| Example 9 | 0.155 | 0.020 | 0.069 | 1.005 | 0.18 |
| Example 10 | 0.125 | 0.015 | 0.069 | 1.004 | 0.18 |
| Example 11 | 0.180 | 0.008 | 0.050 | 1.004 | 0.18 |
| Example 12 | 0.180 | 0.015 | 0.069 | 1.009 | 0.18 |
| Example 13 | 0.240 | 0.015 | 0.069 | 1.009 | 0.18 |
| Example 14 | 0.300 | 0.015 | 0.069 | 1.009 | 0.18 |
| Example 15 | 0.180 | 0.008 | 0.050 | 1.003 | 0.12 |
| Example 16 | 0.180 | 0.008 | 0.050 | 1.006 | 0.24 |
| Example 17 | 0.180 | 0.008 | 0.050 | 1.005 | 0.30 |
| Example 18 | 0.180 | 0.008 | 0.050 | 1.008 | 0.36 |
| Example 19 | 0.180 | 0.008 | 0.050 | 1.004 | 0.40 |
| Example 20 | 0.180 | 0.008 | 0.050 | 1.005 | 0.18 |
| Example 21 | 0.180 | 0.008 | 0.050 | 1.009 | 0.18 |
| Example 22 | 0.180 | 0.008 | 0.050 | 1.005 | 0.18 |
| Example 23 | 0.180 | 0.008 | 0.050 | 1.004 | 0.18 |
| Comparative example 1 | 0.155 | 0.000 | 0.000 | 0.993 | 0.18 |
| Comparative example 2 | 0.155 | 0.000 | 0.010 | 1.005 | 0.18 |
| Comparative example 3 | 0.155 | 0.020 | 0.075 | 1.003 | 0.18 |
| Comparative example 4 | 0.155 | 0.040 | 0.060 | 1.003 | 0.18 |
| Comparative example 5 | 0.180 | 0.008 | 0.050 | 1.009 | 0.06 |
| Comparative example 6 | 0.180 | 0.008 | 0.050 | 1.005 | 0.42 |
| Comparative example 7 | 0.180 | 0.008 | 0.050 | 1.000 | 0.18 |

A piezoelectric element according to an example of the present invention was then manufactured.

(Manufacture and Characterization of Piezoelectric Element)

(Piezoelectric Elements According to Examples 1 to 23)

The piezoelectric materials according to Examples 1 to 23 were used to manufacture piezoelectric elements.

A gold electrode having a thickness of 400 nm was formed on the front and back sides of the discoidal piezoelectric ceramic by DC sputtering. A titanium film having a thickness of 30 nm was formed as an adhesion layer between the electrode and the piezoelectric ceramic. The piezoelectric ceramic having the electrodes was cut into a 10 mm×2.5 mm×0.5 mm plate-like piezoelectric element.

A 1.4 kV/mm electric field was applied to the piezoelectric element on a hot plate at a temperature in the range of 60° C. to 150° C. for 30 minutes to perform polarization treatment.

The Curie temperature, the piezoelectric constant $d_{31}$, and the mechanical quality factor (Qm) of each of the piezoelectric elements manufactured using piezoelectric materials according to examples and comparative examples of the present invention were measured after polarization treatment. Table 4 shows the results. The "phase transition temperature" in the table indicates the presence of a phase transition temperature in the range of −25° C. to 100° C. "Yes" means the presence of a maximum dielectric constant in a very small alternating electric field at a frequency of 1 kHz at a measurement temperature from −25° C. to 100° C. No means the absence of the maximum dielectric constant. The Curie temperature was a temperature at which the dielectric constant reached its maximum in a very small alternating electric field at a frequency of 1 kHz. The piezoelectric constant $d_{31}$ was measured by a resonance-antiresonance method. Table 4 shows its absolute value. The mechanical quality factor Qm was measured by the resonance-antiresonance method.

TABLE 4

| | Phase transition temperature | Curie temperature [° C.] | Piezoelectric constant $|d_{31}|$ [pC/N] | Mechanical quality factor Qm |
|---|---|---|---|---|
| Example 1 | No | 112 | 88 | 1070 |
| Example 2 | No | 115 | 84 | 1000 |
| Example 3 | No | 112 | 87 | 1050 |
| Example 4 | No | 108 | 91 | 1110 |
| Example 5 | No | 113 | 90 | 1100 |
| Example 6 | No | 106 | 105 | 1200 |
| Example 7 | No | 111 | 98 | 1130 |
| Example 8 | No | 105 | 103 | 1170 |
| Example 9 | No | 102 | 105 | 1220 |
| Example 10 | Yes | 106 | 108 | 1420 |
| Example 11 | No | 113 | 85 | 1000 |
| Example 12 | No | 106 | 100 | 1100 |
| Example 13 | No | 104 | 98 | 1020 |
| Example 14 | No | 105 | 93 | 990 |
| Example 15 | No | 114 | 90 | 850 |
| Example 16 | No | 115 | 79 | 1080 |
| Example 17 | No | 115 | 72 | 1140 |
| Example 18 | No | 114 | 66 | 1220 |
| Example 19 | No | 114 | 61 | 1310 |
| Example 20 | No | 113 | 88 | 1110 |
| Example 21 | No | 114 | 86 | 1150 |
| Example 22 | No | 114 | 83 | 1020 |
| Example 23 | No | 113 | 78 | 930 |
| Comparative example 1 | No | 130 | 35 | 894 |
| Comparative example 2 | No | 127 | 43 | 985 |
| Comparative example 3 | Yes | 96 | 115 | 1612 |
| Comparative example 4 | Yes | 75 | 141 | 1823 |
| Comparative example 5 | No | 112 | 95 | 393 |
| Comparative example 6 | No | 113 | 48 | 1420 |
| Comparative example 7 | No | 108 | 45 | 530 |

Example 11 and Examples 20 to 23 are compared. Although Example 11 and Examples 20 to 23 had the same x, y, z, and Mn content, Examples 20 to 22, which contained an auxiliary component Mg, had higher Qm than Example 11.

In all the examples, even when the electrodes were made of baked silver paste, the same characteristics as in the case of the gold electrode were obtained.

Example 10 had a phase transition temperature of −20° C. This corresponds to a low temperature end of the temperature range of −25° C. to 100° C. and therefore had no significant influence on the stable operation of the piezoelectric element.

(Piezoelectric Elements According to Comparative Examples 1 to 7)

The piezoelectric materials according to Comparative Examples 1 to 7 were used to manufacture piezoelectric elements in the same manner as in Examples 1 to 23.

The piezoelectric elements were evaluated in the same manner as in Examples 1 to 23. Table 4 shows the results.

The piezoelectric elements containing no Sn according to Comparative Examples 1 and 2 in which z representing the amount of Zr was less than 0.041 had a lower $|d_{31}|$ (50 [µm/V] or less) than the piezoelectric elements according to Examples 1 to 23.

The piezoelectric element according to Comparative Example 3, which had z of more than 0.069, had lower durability than the piezoelectric elements according to Examples 1 to 23 because of the presence of a phase transition temperature in the range of −25° C. to 100° C.

The piezoelectric element according to Comparative Example 4, which had y of more than 0.020, had lower durability than the piezoelectric elements according to Examples 1 to 23 because of the presence of a phase transition temperature in the range of −25° C. to 100° C.

The piezoelectric element according to Comparative Example 5, which contained less than 0.12 parts by weight of Mn, had much lower operation efficiency than the piezoelectric elements according to Examples 1 to 23 because of its low Qm of less than 800.

The piezoelectric element according to Comparative Example 6, which contained more than 0.40 parts by weight of Mn, had lower $|d_{31}|$ (50 [pm/V] or less) than the piezoelectric elements according to Examples 1 to 23.

The piezoelectric element according to Comparative Example 7, which contained more than 0.100 parts by weight of Mg, had lower $|d_{31}|$ (50 [µm/V] or less) than the piezoelectric elements according to Examples 1 to 23 and had much lower operation efficiency than the piezoelectric elements according to Examples 1 to 23 because of its low Qm of less than 800.

(Evaluation of Durability of Piezoelectric Element)

In order to examine the durability of the piezoelectric elements according to Examples 1 to 9 and Comparative Examples 3 and 4, they were subjected to a hundred of temperature cycles of 25° C.→−25° C.→50° C.→25° C. in a thermostat. Table 5 shows the rate of change in piezoelectric constant $d_{31}$ in the cycle test.

TABLE 5

| | Phase transition temperature | Piezoelectric constant before cycle test $|d_{31}|$ [pC/N] | Piezoelectric constant after cycle test $|d_{31}|$ [pC/N] | Rate of change [%] |
|---|---|---|---|---|
| Example 1 | No | 88 | 86 | −2.8 |
| Example 2 | No | 84 | 80 | −4.6 |
| Example 3 | No | 87 | 85 | −2.4 |
| Example 4 | No | 91 | 87 | −4.7 |
| Example 5 | No | 90 | 86 | −4.5 |
| Example 6 | No | 105 | 101 | −3.9 |
| Example 7 | No | 98 | 95 | −3.3 |
| Example 8 | No | 103 | 99 | −4.3 |
| Example 9 | No | 105 | 102 | −2.9 |
| Comparative example 3 | Yes | 115 | 86 | −25.3 |
| Comparative example 4 | Yes | 141 | 112 | −20.5 |

The piezoelectric constants of the piezoelectric elements according to Comparative Examples 3 and 4 decreased significantly by much more than 10%. Thus, these piezoelectric elements had low durability. The piezoelectric elements according to Comparative Examples 3 and 4 had a phase transition temperature of 4° C. and 40° C., respectively, which is in the middle of the operating temperature range. Thus, the piezoelectric property of these piezoelectric elements deteriorated significantly during the cycle test.

(Manufacture and Evaluation of Multilayered Piezoelectric Element)

A multilayered piezoelectric element according to an example of the present invention was manufactured.

(Example 24)

A raw material having the composition $(Ba_{0.845}Ca_{0.155})_{1.004}(Ti_{0.942}Sn_{0.008}Zr_{0.050})O_3$, which is represented by the general formula $(Ba_{1-x}Ca_x)_a(Ti_{1-y-z}Sn_yZr_z)O_3$, wherein x=0.155, y=0.0075, z=0.05, and a=1.004, was weighed as described below.

Barium carbonate, calcium carbonate, titanium oxide, tin oxide, and zirconium oxide each having a purity of 99.99% or more were weighed as the raw materials of the main component such that Ba, Ca, Ti, Sn, and Zr satisfied the composition $(Ba_{0.845}Ca_{0.155})_{1.004}(Ti_{0.942}Sn_{0.008}Zr_{0.050})O_3$.

These weighed powders were mixed with an amount of manganese (IV) oxide corresponding to 0.18 parts by weight of Mn on a metal basis and 3 parts by weight of a PVB binder per 100 parts by weight of the weighed powder. This mixed powder was formed into a green sheet having a thickness of 50 µm by a doctor blade method.

An electrically conductive paste for an internal electrode was applied to the green sheet. The electrically conductive paste was a Ni paste. Nine green sheets to which the electrically conductive paste had been applied were stacked and were heat-pressed.

The heat-pressed multilayered body was fired in a tubular furnace. The heat-pressed multilayered body was fired to a temperature up to 300° C. in the ambient atmosphere to remove the binder and was then held at 1380° C. for 5 hours in a reducing atmosphere ($H_2:N_2$=2:98, an oxygen concentration of $2\times10^{-6}$ Pa). During cooling to room temperature, the oxygen concentration was increased to 30 Pa at a temperature of 1000° C. or less.

The sintered body was cut into a 10 mm×2.5 mm piece. The side surface of the piece was polished. A pair of external electrodes (a first electrode and a second electrode) for alternately connecting internal electrodes were formed by Au sputtering. Thus, a multilayered piezoelectric element as illustrated in FIG. 3B was manufactured.

The observation of the internal electrodes of the multilayered piezoelectric element showed that the electrode material Ni and piezoelectric material layers were alternately stacked on top of one another. A 1 kV/mm electric field was applied to the multilayered piezoelectric element on a hot plate at a temperature in the range of 60° C. to 100° C. for 30 minutes to perform polarization treatment.

The evaluation of the piezoelectric property of the multilayered piezoelectric element showed that the multilayered piezoelectric element had a satisfactory insulation property and had a satisfactory piezoelectric property similar to the piezoelectric element according to Example 1.

(Comparative Example 8)

A multilayered piezoelectric element was manufactured in the same manner as in Example 24 except that the composition according to Comparative Example 1 was employed.

The observation of a piezoelectric material layer of the multilayered piezoelectric element showed the presence of a plurality of crystal grains having a grain size in the range of 30 to 40 μm. Thus, the multilayered piezoelectric element had very low strength and could not be evaluated with respect to the piezoelectric property.

(Manufacture and Evaluation of Device)
(Liquid Discharge Head According to Example 1)

A liquid discharge head illustrated in FIGS. 3A and 3B was manufactured using the piezoelectric element according to Example 1. An ink was discharged in response to the input of an electric signal.

(Liquid Discharge Apparatus Including Liquid Discharge Head According to Example 1)

A liquid discharge apparatus illustrated in FIG. 4 was manufactured using the liquid discharge head illustrated in FIGS. 3A and 3B. The liquid discharge head included the piezoelectric element according to Example 1. An ink was discharged onto a transfer medium in response to the input of an electric signal.

(Liquid Discharge Head According to Example 24)

A liquid discharge head illustrated in FIGS. 3A and 3B was manufactured using the multilayered piezoelectric element according to Example 24. An ink was discharged in response to the input of an electric signal.

(Liquid Discharge Apparatus Including Liquid Discharge Head According to Example 24)

A liquid discharge apparatus illustrated in FIG. 4 was manufactured using the liquid discharge head illustrated in FIGS. 3A and 3B. The liquid discharge head included the multilayered piezoelectric element according to Example 24. An ink was discharged onto a transfer medium in response to the input of an electric signal.

(Ultrasonic Motor According to Example 11)

An ultrasonic motor illustrated in FIG. 6A was manufactured using the piezoelectric element according to Example 11. Upon the application of an alternating voltage, the motor rotated.

(Lens Barrel Including Ultrasonic Motor According to Example 11)

An optical apparatus illustrated in FIG. 8 was manufactured using an ultrasonic motor including the piezoelectric element according to Example 11. Upon the application of an alternating voltage, automatic focusing was observed.

(Ultrasonic Motor According to Example 24)

An ultrasonic motor illustrated in FIG. 6B was manufactured using the multilayered piezoelectric element according to Example 24. Upon the application of an alternating voltage, the motor rotated.

(Dust Removing Device as Example of Vibratory Apparatus According to Example 11)

A dust removing device illustrated in FIGS. 9A and 9B was manufactured using the piezoelectric element according to Example 11. Upon the application of an alternating voltage after plastic beads were scattered, satisfactory dust removing was observed.

(Dust Removing Device as Example of Vibratory Apparatus According to Example 24)

A dust removing device illustrated in FIGS. 9A and 9B was manufactured using the multilayered piezoelectric element according to Example 24. Upon the application of an alternating voltage after plastic beads were scattered, satisfactory dust removing was observed.

(Image Pickup Apparatus Including Dust Removing Device According to Example 11)

An image pickup apparatus illustrated in FIG. 13 was manufactured using a dust removing device including the piezoelectric element according to Example 11 and an image pickup element unit. Dust on a surface of the image pickup element unit was satisfactorily removed, and images free of dust defects were obtained.

(Electronic Equipment Including Piezoelectric Acoustic Component According to Example 11)

Electronic equipment illustrated in FIG. 14 was manufactured using a piezoelectric acoustic component including the piezoelectric element according to Example 11. Upon the application of an alternating voltage, a loudspeaker operated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-242782, filed Nov. 2, 2012, which is hereby incorporated by reference herein in its entirety.

INDUSTRIAL APPLICABILITY

A piezoelectric material according to an embodiment of the present invention has a high and stable piezoelectric constant and mechanical quality factor in a wide operating temperature range. The piezoelectric material contains no lead and can reduce the load on the environment. Thus, the piezoelectric material can be used without problems for apparatuses manufactured using a large amount of piezoelectric material, such as liquid discharge heads, liquid discharge apparatuses, ultrasonic motors, optical apparatuses, vibratory apparatuses, dust removing devices, image pickup apparatuses, and electronic equipment.

REFERENCE SIGNS LIST 1 first electrode
2 piezoelectric material
3 second electrode
101 piezoelectric element
102 individual liquid chamber
103 diaphragm
104 liquid chamber partition wall
105 discharge port
106 communicating hole
107 common liquid chamber
108 buffer layer
1011 first electrode
1012 piezoelectric material
1013 second electrode
201 oscillator
202 rotor
203 output shaft
204 oscillator
205 rotor
206 spring
2011 elastic ring
2012 piezoelectric element
2013 organic adhesive
2041 metal elastic body
2042 multilayered piezoelectric element
310 dust removing device
330 piezoelectric element
320 diaphragm
331 piezoelectric material
332 first electrode
333 second electrode 336 first electrode surface
337 second electrode surface
51 first electrode
53 second electrode
54 piezoelectric material layer
55 internal electrode
501 first electrode
503 second electrode
504 piezoelectric material layer
505a internal electrode
505b internal electrode
506a external electrode
506b external electrode
601 camera main body
602 mount
605 mirror box
606 main mirror
200 shutter unit
300 main body chassis
400 image pickup element unit
701 front lens group lens
702 rear lens group lens (focus lens)
711 removable mount
712 fixed barrel
713 linear guide barrel
714 front lens group barrel
715 cam ring
716 rear lens group barrel
717 cam roller
718 screw
719 roller
720 rotation transmitting ring
722 driven roller
724 manual focus ring
725 ultrasonic motor
726 wave washer
727 ball race
728 focus key
729 joint member
732 washer
733 low-friction sheet
881 liquid discharge apparatus
882 exterior
883 exterior
884 exterior
885 exterior
887 exterior
890 recovering section
891 recording portion
892 carriage
896 main body of apparatus
897 automatic feeder
898 outlet
899 conveying unit
901 optical device
908 release button
909 electronic flash unit
912 loudspeaker
914 microphone
916 fill light unit
931 main body
932 zoom lever
933 power switch

Advantageous Effects of Invention

The present invention can provide a lead-free piezoelectric material having a high and stable piezoelectric constant and mechanical quality factor in a wide operating temperature range. The present invention can also provide a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the lead-free piezoelectric material.

The invention claimed is:
1. A piezoelectric material comprising
a perovskite type metal oxide having the general formula (1); and
a Mn content,
wherein the Mn content is 0.12 parts by weight or more and 0.40 parts by weight or less on a metal basis per 100 parts by weight of the metal oxide

$$(Ba_{1-x}Ca_x)_a(Ti_{1-y-z}Sn_yZr_z)O_3 \quad (1)$$

wherein $1.00 \leq a \leq 1.01$, $0.125 \leq x \leq 0.300$, $0 < y \leq 0.020$, and $0.041 \leq z \leq 0.069$.

2. The piezoelectric material according to claim 1, wherein z in the general formula (1) is equal to or less than $-2y+0.100$.

3. The piezoelectric material according to claim 1, wherein the piezoelectric material has no structural phase transition temperature in the range of $-25°$ C. to $100°$ C.

4. The piezoelectric material according to claim 1, wherein the piezoelectric material contains crystal grains having an average equivalent circular diameter of 1 μm or more and 10 μm or less.

5. The piezoelectric material according to claim 1, wherein the piezoelectric material has a relative density of 93% or more and 100% or less.

6. The piezoelectric material according to claim 1, wherein 100 parts by weight of the piezoelectric material contains 0.10 parts by weight or less of Mg on a metal basis as an auxiliary component.

7. A piezoelectric element, comprising: a first electrode; a piezoelectric material; and a second electrode, wherein the piezoelectric material is the piezoelectric material according to claim 1.

8. A multilayered piezoelectric element, comprising piezoelectric material layers and electrode layers alternately stacked on top of one another, the electrode layers including an internal electrode, wherein the piezoelectric material layers are formed of the piezoelectric material according to claim 1.

9. A liquid discharge head, comprising: a liquid chamber; and a discharge port in communication with the liquid chamber, wherein the liquid chamber has a vibrating unit that includes the piezoelectric element according to claim 7.

10. A liquid discharge apparatus, comprising: a mounting portion for a transfer medium; and the liquid discharge head according to claim 9.

11. An ultrasonic motor, comprising: a vibrating member that includes the piezoelectric element according to claim 7 and a moving body in contact with the vibrating member.

12. An optical apparatus, comprising a drive unit that includes the ultrasonic motor according to claim 11.

13. A vibratory apparatus, comprising a vibrating member that includes the piezoelectric element according to claim 7.

14. A dust removing device, comprising a vibrating unit that includes the vibratory apparatus according to claim 13 disposed on a diaphragm.

15. An image pickup apparatus, comprising: the dust removing device according to claim 14; and an image pickup element unit, wherein the dust removing device includes a diaphragm on a light-receiving surface of the image pickup element unit.

16. Electronic equipment, comprising a piezoelectric acoustic component that includes the piezoelectric element according to claim 7.

17. A liquid discharge head, comprising: a liquid chamber; and a discharge port in communication with the liquid chamber, wherein the liquid chamber has a vibrating unit that includes the multilayered piezoelectric element according to claim 8.

18. A liquid discharge apparatus, comprising: a mounting portion for a transfer medium; and the liquid discharge head according to claim 17.

19. An ultrasonic motor, comprising: a vibrating member that includes the multilayered piezoelectric element according to claim 8; and a moving body in contact with the vibrating member.

20. An optical apparatus, comprising a drive unit that includes the ultrasonic motor according to claim 19.

21. A vibratory apparatus, comprising a vibrating member that includes the multilayered piezoelectric element according to claim 8.

22. A dust removing device, comprising a vibrating unit that includes the vibratory apparatus according to claim 21 disposed on a diaphragm.

23. An image pickup apparatus, comprising: the dust removing device according to claim 22; and an image pickup element unit, wherein the dust removing device includes a diaphragm on a light-receiving surface of the image pickup element unit.

24. Electronic equipment, comprising a piezoelectric acoustic component that includes the multilayered piezoelectric element according to claim 8.

25. A piezoelectric material comprising:
an oxide containing Ba, Ca, Ti, Sn, and Zr; and
a Mn content,
wherein a value x which is a molar ratio of Ca to the sum of the number of moles of Ba and Ca is $0.125 \leq x \leq 0.300$,
wherein a value y which is a molar ratio of Sn to the sum of the number of moles of Ti, Sn, and Zr is $0 < y \leq 0.020$,
wherein a value z which is a molar ratio of Zr to the sum of the number of moles of Ti, Sn, and Zr is $0.041 \leq z \leq 0.069$, and
wherein the Mn content is 0.12 parts by weight or more and 0.40 parts by weight or less on an oxide basis per 100 parts by weight of the oxide containing Ba, Ca, Ti, Sn, and Zr.

26. A piezoelectric element comprising:
a first electrode;
a piezoelectric material portion; and
a second electrode,
wherein the piezoelectric material portion comprises the piezoelectric material according to claim 25.

27. A multilayered piezoelectric element comprising:
piezoelectric material layers; and
electrode layers including an internal electrode,
wherein the piezoelectric material layers and the electrode layers are alternately stacked, and
wherein the piezoelectric material layers comprise the piezoelectric material according to claim 25.

28. An electronic apparatus comprising the piezoelectric element according to claim 26.

29. An electronic apparatus comprising the multilayered piezoelectric element according to claim 27.

* * * * *